(12) United States Patent
Ma et al.

(10) Patent No.: US 11,908,430 B2
(45) Date of Patent: Feb. 20, 2024

(54) DISPLAY SUBSTRATE AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Rui Ma, Beijing (CN); Xiaoye Ma, Beijing (CN); Xianjie Shao, Beijing (CN); Ruifang Du, Beijing (CN)

(73) Assignees: HEFEI XINSHENG OPTOELECTRONICS TECHNOLOGY CO., LTD., Hefei (CN); BOE TECHNOLOGY GROUP CO., LTD. LTD., Beijing (CN)

( * ) Notice: Subject to any disclaimer, the term of this patent is extended or adjusted under 35 U.S.C. 154(b) by 0 days.

(21) Appl. No.: 17/778,566
(22) PCT Filed: May 19, 2021
(86) PCT No.: PCT/CN2021/094472
§ 371 (c)(1),
(2) Date: May 20, 2022
(87) PCT Pub. No.: WO2021/258926
PCT Pub. Date: Dec. 30, 2021

(65) Prior Publication Data
US 2023/0012488 A1    Jan. 19, 2023

(30) Foreign Application Priority Data
Jun. 24, 2020 (CN) .......................... 202010592567.8

(51) Int. Cl.
*G09G 3/36* (2006.01)
*G09G 3/3266* (2016.01)
(Continued)

(52) U.S. Cl.
CPC ......... *G09G 3/3677* (2013.01); *G09G 3/3266* (2013.01); *G09G 3/3674* (2013.01);
(Continued)

(58) Field of Classification Search
CPC .. G09G 3/3677; G09G 3/3266; G09G 3/3674; G09G 3/32; G09G 2300/0426;
(Continued)

(56) References Cited

U.S. PATENT DOCUMENTS 9,698,180 B2   7/2017 Chen et al.
10,559,278 B2  2/2020 Du et al.
(Continued)

FOREIGN PATENT DOCUMENTS

CN   104867472 A   8/2015
CN   105405808 A   3/2016
(Continued)

OTHER PUBLICATIONS

International Search Report in PCT/CN2021/094472 in Chinese dated Jul. 29, 2021 with English translation.
(Continued)

*Primary Examiner* — Adam J Snyder
(74) *Attorney, Agent, or Firm* — Collard & Roe, P.C.

(57) ABSTRACT

A display substrate and a display device are disclosed. The display substrate includes a base substrate and a plurality of shift register units; each of the plurality of shift register units includes an input circuit, an output circuit, a first reset circuit and a frame reset signal connection wire; the frame reset signal connection wire and is configured to provide a frame reset signal to the first reset circuit; the first reset circuit is configured to respond to the frame reset signal, so as to reset a first node and an output end within a time period between two display frames of the display substrate; the first reset circuit includes a first transistor and a second transistor, and the frame reset signal connection wire, a gate of the first transistor and a gate of the second transistor are provided on a first conductive layer.

17 Claims, 18 Drawing Sheets

(51) Int. Cl.
*G11C 19/28* (2006.01)
*G02F 1/1345* (2006.01)
*G09G 3/32* (2016.01)

(52) U.S. Cl.
CPC ............ *G11C 19/28* (2013.01); *G02F 1/1345* (2013.01); *G02F 1/13454* (2013.01); *G09G 3/32* (2013.01); *G09G 2300/0426* (2013.01); *G09G 2310/0286* (2013.01); *G09G 2310/061* (2013.01); *G09G 2330/06* (2013.01)

(58) Field of Classification Search
CPC ..... G09G 2310/0286; G09G 2310/061; G09G 2300/06; G11C 19/28; G02F 1/1345; G02F 1/13454
See application file for complete search history.

(56) References Cited

U.S. PATENT DOCUMENTS

| | | | |
|---|---|---|---|
| 10,997,890 | B2 | 5/2021 | Hao et al. |
| 11,156,882 | B2 | 10/2021 | Qin et al. |
| 11,189,243 | B2 | 11/2021 | Tang et al. |
| 2012/0235983 | A1* | 9/2012 | Sakamoto ............ G09G 3/3677 345/212 |
| 2017/0309240 | A1 | 10/2017 | Zhang et al. |
| 2019/0251928 | A1* | 8/2019 | Du ..................... G09G 3/20 |

FOREIGN PATENT DOCUMENTS

| | | | | |
|---|---|---|---|---|
| CN | 108053789 | A | * 5/2018 | ............... G09G 3/20 |
| CN | 108053789 | A | 5/2018 | |
| CN | 108182921 | A | 6/2018 | |
| CN | 108563082 | A | 9/2018 | |
| CN | 108648685 | A | * 10/2018 | ............... G09G 3/20 |
| CN | 108962118 | A | 12/2018 | |
| CN | 208834749 | U | 5/2019 | |
| CN | 110415637 | A | 11/2019 | |
| CN | 110503921 | A | 11/2019 | |
| CN | 110648621 | A | 1/2020 | |
| CN | 110827783 | A | 2/2020 | |
| CN | 111210758 | A | 5/2020 | |

OTHER PUBLICATIONS

Written Opinion in PCT/CN2021/094472 in Chinese dated Jul. 29, 2021.

* cited by examiner

DISPLAY SUBSTRATE AND DISPLAY DEVICE

CROSS-REFERENCE TO RELATED APPLICATION

This application is the National Stage of PCT/CN2021/094472 filed on May 19, 2021, which claims priority under 35 U.S.C. § 119 of Chinese Application No. 202010592567.8 filed on Jun. 24, 2020, the disclosure of which is incorporated by reference.

TECHNICAL FIELD

The embodiments of the present disclosure relate to a display substrate and a display device.

BACKGROUND

In the field of display technology, for example, a pixel array of a liquid crystal display usually includes a plurality of rows of gate lines and a plurality of columns of data lines staggered with the plurality of rows of gate lines. The driving for the plurality of rows of gate lines may be achieved by the attached integrated drive circuit. In recent years, with the continuous improvement of amorphous silicon thin film technology, a gate line drive circuit may also be directly integrated on the thin film transistor array substrate to form a GOA (Gate-driver On Array) to drive the plurality of rows of gate lines.

For example, a GOA composed of a plurality of cascaded shift register units may be used to provide on-off voltage signals for the plurality of rows of gate lines in the pixel array, so as to control the plurality of rows of gate lines to be turned on in sequence, the data lines are used to provide data signals to the pixel units of the corresponding row in the pixel array, so as to form gray voltages required for respective gray levels of the displayed image, and then display each frame of the image.

SUMMARY

At least one embodiment of the present disclosure provides a display substrate, comprising: a base substrate and a plurality of shift register units disposed on the base substrate, wherein the plurality of shift register units are arranged side by side along a first direction; each shift register unit of the plurality of shift register units comprises an input circuit, an output circuit, a first reset circuit, and a frame reset signal connection line; the frame reset signal connection line extends along a second direction and is configured to provide a frame reset signal to the first reset circuit, the second direction and the first direction cross each other; the input circuit is configured to control a level of a first node in response to an input signal; the output circuit is configured to receive a clock signal and output the clock signal as an output signal to an output terminal under control of the level of the first node; the first reset circuit is configured to reset the first node and the output terminal during a period of time between two display frames of the display substrate in response to the frame reset signal; the first reset circuit comprises a first transistor and a second transistor, and the frame reset signal connection line, a gate electrode of the first transistor, and a gate electrode of the second transistor are disposed in a first conductive layer; and the shift register unit further comprises a first transfer electrode in a second conductive layer, the gate electrode of the first transistor and the gate electrode of the second transistor are connected and both are electrically connected to the frame reset signal connection line through the first transfer electrode.

For example, in the display substrate provided by at least one embodiment of the present disclosure, the first transistor and the second transistor are arranged adjacently along the second direction; the shift register unit further comprises a first voltage connection line extending along the second direction, the first voltage connection line is configured to provide a first voltage to the shift register unit, and the first voltage is used to reset the first node and the output terminal during the period of time between the two display frames of the display substrate; the first voltage connection line, a first electrode of the first transistor and a second electrode of the first transistor, and a first electrode of the second transistor and a second electrode of the second transistor are all disposed in the second conductive layer; the first electrode of the first transistor is electrically connected to the first node, the first electrode of the second transistor is electrically connected to the output terminal, and the second electrode of the first transistor and the second electrode of the second transistor are both electrically connected to the first voltage connection line.

For example, in the display substrate provided by at least one embodiment of the present disclosure, the shift register unit further comprises a branch line disposed in the second conductive layer and extending along the first direction, and the branch line is connected to the first voltage connection line; the second electrode of the first transistor and the second electrode of the second transistor are respectively arranged on both sides of the branch line, and both are connected to the branch line.

For example, in the display substrate provided by at least one embodiment of the present disclosure, a size of the first transistor and a size of the second transistor are identical.

For example, in the display substrate provided by at least one embodiment of the present disclosure, the plurality of shift register units comprise a first shift register unit and a second shift register unit that are adjacently arranged in the first direction, the first shift register unit and the second shift register unit share a same first voltage connection line, and are distributed axially symmetrically with respect to the same first voltage connection line.

For example, in the display substrate provided by at least one embodiment of the present disclosure, the shift register unit further comprises an input signal connection line extending along the second direction, the input signal connection line is configured to provide the input signal to the input circuit; the input circuit comprises a third transistor, the input signal connection line and a gate electrode of the third transistor are both disposed in the first conductive layer, and the gate electrode of the third transistor is connected to the input signal connection line; both a first electrode and a second electrode of the third transistor are disposed in the second conductive layer, the first electrode of the third transistor is electrically connected to the gate electrode of the third transistor, the second electrode of the third transistor is connected to the first electrode of the first transistor, and the first node is a junction node of the second electrode of the third transistor and the first electrode of the first transistor.

For example, in the display substrate provided by at least one embodiment of the present disclosure, the shift register unit further comprises a second transfer electrode disposed in the first conductive layer and a third transfer electrode disposed in the second conductive layer, an orthographic projection of the second transfer electrode on the base substrate and an orthographic projection of the third transfer electrode on the base substrate at least partially overlap; the second transfer electrode is connected to the gate electrode of the third transistor, the third transfer electrode is connected to the first electrode of the third transistor, and the second transfer electrode is electrically connected to the third transfer electrode.

For example, in the display substrate provided by at least one embodiment of the present disclosure, the first electrode of the third transistor comprises a first connection portion extending along the first direction and a plurality of first protrusion portions extending along the second direction, the first connection portion is connected to the third transfer electrode, the plurality of first protrusion portions are connected to the first connection portion, respectively, and a plurality of first concave portions are formed between the plurality of first protrusion portions; the second electrode of the third transistor comprises a second connection portion extending along the first direction and a plurality of second protrusion portions extending along the second direction, the plurality of second protrusion portions are connected to the second connection portion, respectively, and a plurality of second concave portions are formed between the plurality of second protrusion portions; the plurality of first protrusion portions protrude into the plurality of second concave portions, so that the plurality of second protrusion portions and the plurality of first protrusion portions are sequentially spaced along the first direction.

For example, in the display substrate provided by at least one embodiment of the present disclosure, the shift register unit further comprises a clock signal connection line extending along the second direction, the clock signal connection line is configured to provide a clock signal to the output circuit; the output circuit comprises a fourth transistor and a first capacitor; a gate electrode of the fourth transistor and a first electrode of the first capacitor are disposed in the first conductive layer, and the first electrode of the first capacitor is on a side of the gate electrode of the fourth transistor close to a display region of the display substrate; a first electrode of the fourth transistor, a second electrode of the fourth transistor, a second electrode of the first capacitor, and the clock signal connection line are all disposed in the second conductive layer; the gate electrode of the fourth transistor is electrically connected to the second electrode of the third transistor, the first electrode of the fourth transistor is connected to the clock signal connection line to receive the clock signal, and the second electrode of the fourth transistor is connected to the first electrode of the second transistor; the first electrode of the first capacitor is connected to the gate electrode of the fourth transistor, and the second electrode of the first capacitor is connected to the second electrode of the fourth transistor.

For example, in the display substrate provided by at least one embodiment of the present disclosure, the fourth transistor comprises a plurality of sub-transistors connected in parallel along the second direction, each of the plurality of sub-transistors comprises a gate electrode disposed in the first conductive layer, a first electrode and a second electrode disposed in the second conductive layer, and an active layer disposed in the semiconductor layer; gate electrodes of the plurality of sub-transistors are connected to each other, first electrodes of the plurality of sub-transistors are connected to each other, second electrodes of the plurality of sub-transistors are connected to each other, and active layers of the plurality of sub-transistors are sequentially arranged along the second direction and are independent and unconnected with each other.

For example, in the display substrate provided by at least one embodiment of the present disclosure, an orthographic projection of the clock signal connection line on the base substrate and an orthographic projection of the input signal connection line on the base substrate partially overlap and are partially parallel.

For example, in the display substrate provided by at least one embodiment of the present disclosure, the shift register unit further comprises a fourth transfer electrode disposed in the first conductive layer and a fifth transfer electrode disposed in the second conductive layer, an orthographic projection of the fourth transfer electrode on the base substrate and an orthographic projection of the fifth transfer electrode on the base substrate at least partially overlap, and the fourth transfer electrode is electrically connected to the fifth transfer electrode; the fourth transfer electrode is between the gate electrode of the third transistor and the gate electrode of the first transistor, and the fifth transfer electrode is between the second electrode of the third transistor and the first electrode of the first transistor; the fourth transfer electrode is electrically connected to the gate electrode of the fourth transistor, and the fifth transfer electrode is connected to the first electrode of the first transistor and the second electrode of the third transistor.

For example, in the display substrate provided by at least one embodiment of the present disclosure, the shift register unit further comprises a first connection electrode disposed in the first conductive layer, and two ends of the first connection electrode are respectively connected to the gate electrode of the fourth transistor and the fourth transfer electrode; the first connection electrode is on a side of the input signal connection line close to the first transistor, and an orthographic projection of the first connection electrode on the base substrate and an orthographic projection of the input signal connection line on the base substrate are partially parallel.

For example, in the display substrate provided by at least one embodiment of the present disclosure, the shift register unit further comprises a control circuit, and the control circuit is configured to control a level of a second node according to the level of the first node; the control circuit comprises a fifth transistor, a sixth transistor, a seventh transistor, and an eighth transistor, a gate electrode of the fifth transistor, a gate electrode of the sixth transistor, a gate electrode of the seventh transistor, and a gate electrode of the eighth transistors are all disposed in the first conductive layer, and a first electrode of the fifth transistor, a second electrode of the fifth transistor, a first electrode of the sixth transistor, a second electrode of the sixth transistor, a first electrode of the seventh transistor, a second electrode of the seventh transistor, a first electrode of the eighth transistor, and a second electrode of the eighth transistor all are disposed in the second conductive layer; the gate electrode of the eighth transistor is electrically connected to the first electrode of the eighth transistor and is configured to receive a second voltage different from the first voltage, the second electrode of the eighth transistor is connected to the first electrode of the seventh transistor, the gate electrode of the seventh transistor is connected to the gate electrode of the sixth transistor, and the second electrode of the seventh transistor is connected to the first voltage connection line; the gate electrode of the fifth transistor is electrically connected to the second electrode of the eighth transistor, the first electrode of the fifth transistor is electrically connected to the first electrode of the sixth transistor, the second electrode of the fifth transistor is electrically connected to the first electrode of the eighth transistor, the gate electrode of the sixth transistor is connected to the fourth transfer electrode, and the second electrode of the sixth transistor is connected to the first voltage connection line; the second node is a junction point of the first electrode of the fifth transistor and the first electrode of the sixth transistor.

For example, in the display substrate provided by at least one embodiment of the present disclosure, the eighth transistor, the seventh transistor, and the sixth transistor are arranged adjacently in sequence along the second direction, and the fifth transistor and the eighth transistor are arranged adjacently along the first direction, and the sixth transistor and the third transistor are adjacently arranged along the first direction.

For example, in the display substrate provided by at least one embodiment of the present disclosure, the shift register unit further comprises a sixth transfer electrode disposed in the first conductive layer and a seventh transfer electrode disposed in the second conductive layer, an orthographic projection of the sixth transfer electrode on the base substrate and an orthographic projection of the seventh transfer electrode on the base substrate at least partially overlap, and the sixth transfer electrode is electrically connected to the seventh transfer electrode; the sixth transfer electrode is between the gate electrode of the fifth transistor and the gate electrode of the eighth transistor, and the sixth transfer electrode is connected to the gate electrode of the eighth transistor; the seventh transfer electrode is between the second electrode of the fifth transistor and the first electrode of the eighth transistor, and is connected to the second electrode of the fifth transistor and the first electrode of the eighth transistor.

For example, in the display substrate provided by at least one embodiment of the present disclosure, the shift register unit further comprises an eighth transfer electrode disposed in the first conductive layer and a ninth transfer electrode disposed in the second conductive layer, an orthographic projection of the eighth transfer electrode on the base substrate and an orthographic projection of the ninth transfer electrode on the base substrate at least partially overlap, and the eighth transfer electrode is electrically connected to the ninth transfer electrode; the eighth transfer electrode is on a side of the sixth transfer electrode close to the display region, and the eighth transfer electrode and the sixth transfer electrode are adjacently arranged along the second direction; the ninth transfer electrode is on a side of the seventh transfer electrode close to the display region, and the ninth transfer electrode and the seventh transfer electrode are adjacently arranged along the second direction; the eighth transfer electrode is connected to the gate electrode of the fifth transistor, and the ninth transfer electrode is connected to the second electrode of the eighth transistor and the first electrode of the seventh transistor.

For example, in the display substrate provided by at least one embodiment of the present disclosure, the shift register unit further comprises a second reset circuit, and the second reset circuit is configured to control the level of the second node in response to the input signal; the second reset circuit comprises a ninth transistor, a gate electrode of the ninth transistor is disposed in the first conductive layer, and a first electrode and a second electrode of the ninth transistor are disposed in the second conductive layer; the gate electrode of the ninth transistor is connected to the second transfer electrode, the first electrode of the ninth transistor is connected to the first electrode of the fifth transistor, and the second electrode of the ninth transistor is connected to the second electrode of the seventh transistor.

For example, in the display substrate provided by at least one embodiment of the present disclosure, the fifth transistor, the ninth transistor, and the third transistor are sequentially arranged along the second direction; the second transfer electrode is between the gate electrode of the ninth transistor and the gate electrode of the third transistor; and the ninth transistor and the seventh transistor are arranged adjacently along the first direction.

For example, in the display substrate provided by at least one embodiment of the present disclosure, the shift register unit further comprises a second connection electrode disposed in the second conductive layer, two ends of the second connection electrode are respectively connected to the first electrode of the ninth transistor and the first electrode of the sixth transistor.

For example, in the display substrate provided by at least one embodiment of the present disclosure, the shift register unit further comprises a third reset circuit, the third reset circuit is configured to reset the first node and the output terminal under control of the level of the second node; the third reset circuit comprises a tenth transistor and an eleventh transistor; a gate electrode of the tenth transistor and a gate electrode of the eleventh transistor are disposed in the first conductive layer, and a first electrode of the tenth transistor, a second electrode of the tenth transistor, a first electrode of the eleventh transistor, and a second electrode of the eleventh transistor are disposed in the second conductive layer; the gate electrode of the tenth transistor is connected to the gate electrode of the eleventh transistor, the gate electrode of the tenth transistor and the gate electrode of the eleventh transistor are both electrically connected to the second node, the first electrode of the tenth transistor is connected to the first electrode of the first transistor, the first electrode of the eleventh transistor is connected to the first electrode of the second transistor, and the second electrode of the tenth transistor and the second electrode of the eleventh transistor are both electrically connected to the first voltage connection line.

For example, in the display substrate provided by at least one embodiment of the present disclosure, the tenth transistor and the eleventh transistor are adjacently arranged along the second direction, the tenth transistor and the first transistor are arranged adjacently along the first direction, and the eleventh transistor and the second transistor are arranged adjacently along the first direction.

For example, in the display substrate provided by at least one embodiment of the present disclosure, the shift register unit further comprises a tenth transfer electrode disposed in the first conductive layer and an eleventh transfer electrode disposed in the second conductive layer, an orthographic projection of the tenth transfer electrode on the base substrate and an orthographic projection of the eleventh transfer electrode on the base substrate at least partially overlap, and the tenth transfer electrode is electrically connected to the eleventh transfer electrode; the tenth transfer electrode is between the gate electrode of the sixth transistor and the gate electrode of the tenth transistor, and the tenth transfer electrode is connected to the gate electrode of the tenth transistor; the eleventh transfer electrode is connected to the first electrode of the sixth transistor.

For example, in the display substrate provided by at least one embodiment of the present disclosure, a length of the eleventh transistor is equal to a length of the second transistor, and a length of the tenth transistor is smaller than a length of the eleventh transistor, and a width of the tenth transistor is equal to a width of the eleventh transistor.

For example, in the display substrate provided by at least one embodiment of the present disclosure, the shift register unit further comprises a fourth reset circuit, and the fourth reset circuit is configured to reset the first node in response to a scan reset signal; the fourth reset circuit comprises a twelfth transistor, and the twelfth transistor is on a side of the first capacitor close to the display region; a gate electrode of the twelfth transistor is disposed in the first conductive layer, and a first electrode and a second electrode of the twelfth transistor are disposed in the second conductive layer; the gate electrode of the twelfth transistor is configured to receive the scan reset signal, the first electrode of the twelfth transistor is electrically connected to the first node, and the second electrode of the twelfth transistor is connected to the first voltage connection line.

For example, in the display substrate provided by at least one embodiment of the present disclosure, the shift register unit further comprises a twelfth transfer electrode disposed in the second conductive layer, and the twelfth transfer electrode is connected to the first electrode of the twelfth transistor, an orthographic projection of the twelfth transfer electrode on the base substrate and an orthographic projection of the first electrode of the first capacitor on the base substrate at least partially overlap, and the twelfth transfer electrode is electrically connected to the first electrode of the first capacitor.

For example, in the display substrate provided by at least one embodiment of the present disclosure, a shape of an orthographic projection of one of a first electrode and a second electrode of any transistor in the shift register unit on the base substrate comprises at least one U shape, a shape of an orthographic projection of the other one of the first electrode and the second electrode of the any transistor on the base substrate comprises at least one I shape.

For example, in the display substrate provided by at least one embodiment of the present disclosure, an orthographic projection of a gate electrode of any transistor in the shift register unit on the base substrate covers an orthographic projection of an active layer of the any transistor on the base substrate.

For example, in the display substrate provided by at least one embodiment of the present disclosure, the plurality of shift register units comprises a first shift register unit, a second shift register unit, a third shift register unit, and a fourth shift register unit arranged adjacently in sequence in the first direction; an input circuit of the fourth shift register unit is connected to an output circuit of the first shift register unit to use an output signal of the first shift register unit as an input signal of the fourth shift register unit.

At least one embodiment of the present disclosure provides a display device, comprising the display substrate provided by any one embodiment of the present disclosure.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In display panel technology, in order to achieve low cost and narrow frame, GOA (Gate-driver On Array) technology may be used, that is, a gate drive circuit is integrated on an array substrate of a display panel through a thin film transistor process, so that the advantages such as narrow frame and low assembly cost can be achieved. The display panel may be a liquid crystal display (LCD) panel, an organic light emitting diode (OLED) display panel, or a quantum dot light emitting diode (QLED) display panel.

Figure 1A:
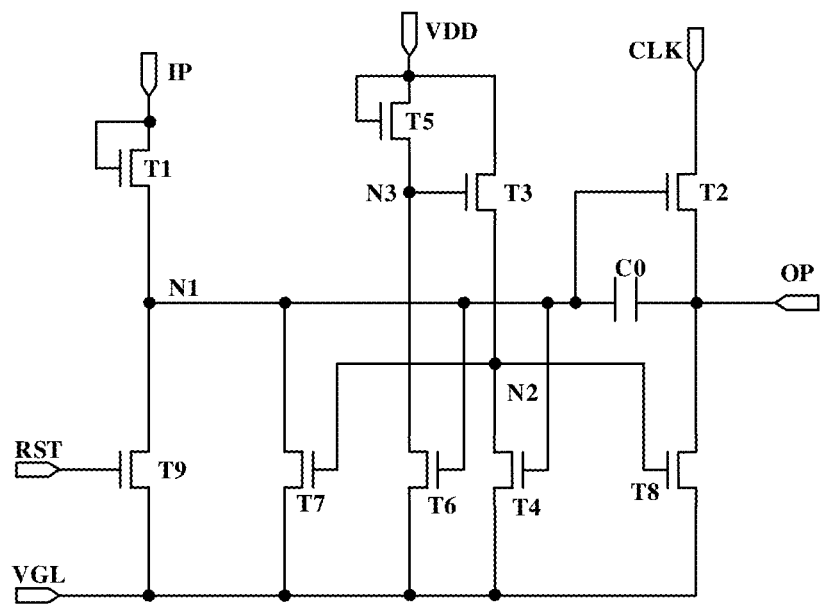
FIG. 1A is a schematic circuit diagram of a shift register unit.

FIG. 1A shows a schematic circuit diagram of a shift register unit, and a plurality of shift register units may be cascaded to form a gate drive circuit. As shown in FIG. 1A, the shift register unit includes nine transistors (T1 to T9) and a storage capacitor (C0). FIG. 1C is a layout diagram corresponding to the shift register unit shown in FIG. 1A, and correspondingly shows the positions of the respective transistors on the display substrate, as well as related electrodes, active layers, lines, and the like.

For the connection relationship among the respective transistors and the storage capacitor in the shift register unit, reference may be made to FIG. 1A, which will not be repeated here. For example, the above transistors are all N-type transistors. The following also takes N-type transistors as an example for description, but the embodiments of the present disclosure are not limited to this situation, for example, at least some of these transistors may be replaced with P-type transistors.

For example, a first voltage terminal VGL in FIG. 1A is configured to be connected to a DC (direct current) low-level signal, a second voltage terminal VDD is configured to be connected to a DC high-level signal, a working principle of the shift register unit shown in FIG. 1A will be described below with reference to the signal timing diagram shown in FIG. 1B. In four phases including a first phase S1, a second phase S2, a third phase S3, and a fourth phase S4 shown in FIG. 1B, the shift register unit performs the following operations.

In the first phase S1, a low-level signal is input to the clock signal terminal CLK, and a high-level signal is input to the input terminal IP. Because the input terminal IP inputs a high-level signal, the first transistor T1 is turned on, so that the high level input from the input terminal IP charges the storage capacitor C0, and the potential of the first node N1 is pulled up to a first high level. For example, in an embodiment of the present disclosure, the first node N1 may be a pull-up node (PU).

Because the second voltage terminal VDD is configured to be connected to the DC high-level signal, the fifth transistor T5 is kept to be turned on, and the high level input from the second voltage terminal VDD charges the third node N3. For example, in an embodiment of the present disclosure, the third node N3 may be a pull-down control node (PD_CN).

Because the potential of the first node N1 is the first high level, the sixth transistor T6 is turned on, so that the third node N3 and the first voltage terminal VGL are electrically connected. When design the transistors, the fifth transistor T5 and the sixth transistor T6 may be configured (for example, configured the size ratio, threshold voltages, etc. of the two transistors) such that when both the fifth transistor T5 and the sixth transistor T6 are turned on, the potential of the third node N3 is pulled down to a low level that does not fully turn on the third transistor T3. Because the potential of the first node N1 is the first high level, the fourth transistor T4 is turned on, so that the potential of the second node N2 is pulled down to a low level. For example, in an embodiment of the present disclosure, the second node N2 may be a pull-down node (PD).

Figure 1B:
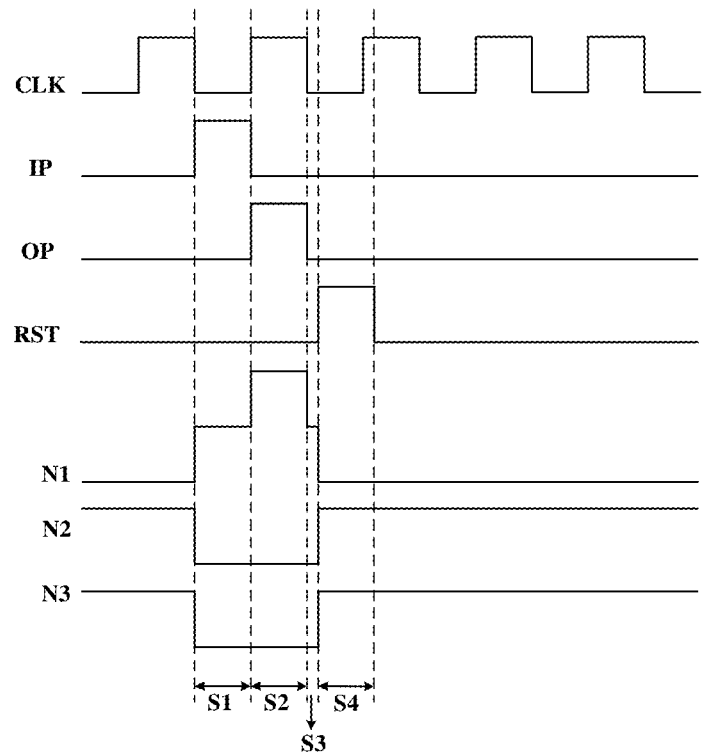
FIG. 1B is a signal timing diagram corresponding to the shift register unit shown in FIG. 1A during operation.
Figure 1C:
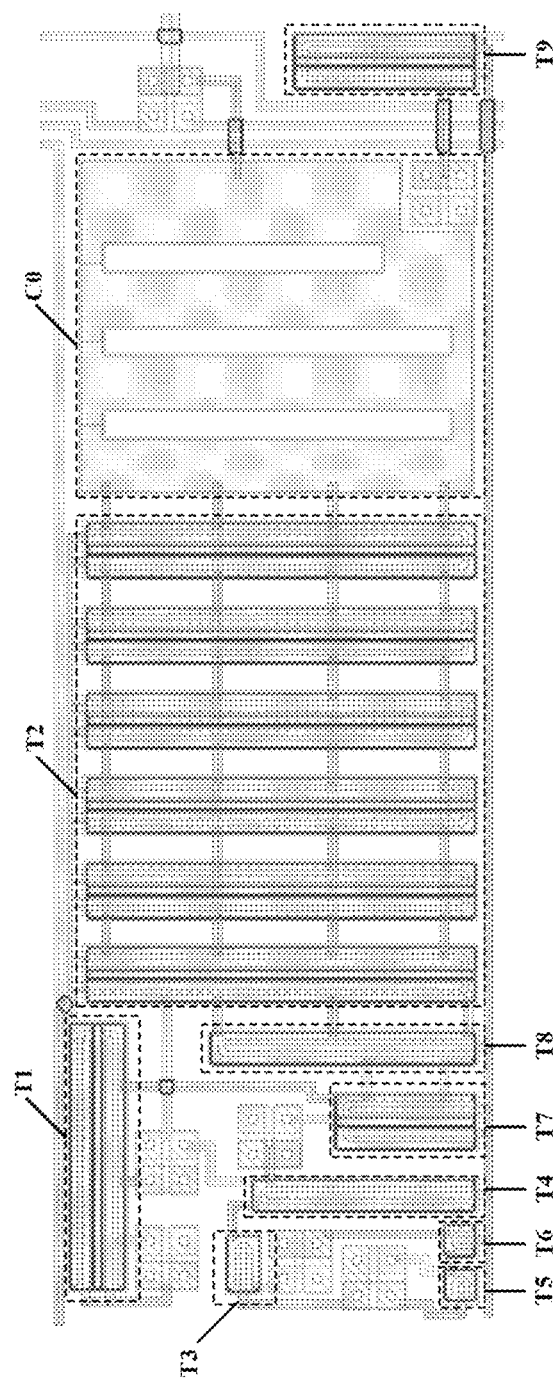
FIG. 1C is a layout diagram corresponding to the shift register unit shown in FIG. 1A.

It should be noted that the potentials in the signal timing diagram shown in FIG. 1B are only schematic and do not represent real potential values.

Because the first node N1 is at the first high level, the second transistor T2 is turned on, and the clock signal terminal CLK inputs a low level at this time, so that in this phase, the output terminal OP outputs the low level.

In the second phase S2, the clock terminal CLK inputs a high-level signal, and the input terminal IP inputs a low-level signal. Because the input terminal IP inputs a low-level signal, the first transistor T1 is turned off, the first node N1 is kept at the first high level of the previous phase, so that the second transistor T2 is kept on. Because the clock signal terminal CLK inputs a high level at this phase, the output terminal OP outputs the high level.

At the same time, because the clock signal terminal CLK and the output terminal OP are at a high level, the high level may increase, by coupling, the potential of the first node N1 to a second high level through the parasitic capacitor of the second transistor T2 (including the parasitic capacitor between the gate electrode and the first electrode of the second transistor T2 and the parasitic capacitor between the gate electrode and the second electrode of the second transistor T2) and the storage capacitor C0, so that the second transistor T2 is turned on more sufficiently. Because the potential of the first node N1 is at a high level, the fourth transistor T4 continues to be turned on, so that the potential of the second node N2 is kept at a low level.

In the third phase S3, the signal input from the clock signal terminal CLK changes from a high level to a low level, and the low level is output to the output terminal OP through the turned-on second transistor T2. In addition, the level change of the clock signal terminal CLK will pull down, by coupling, the potential of the first node N1 to the first high level through the parasitic capacitor of the turned-on second transistor T2 and the storage capacitor C0.

In the fourth phase S4, because a high-level signal is input to the scan reset signal terminal RST, the ninth transistor T9 is turned on, so that the first node N1 is electrically connected to the first voltage terminal VGL, and the potential of the first node N1 is pulled down to a low level, so that the second transistor T2 is turned off.

Because the potential of the first node N1 is at a low level, the sixth transistor T6 and the fourth transistor T4 are turned off, and the discharge paths of the third node N3 and the second node N2 are cut off, the potential of the second node N2 is charged to a high level, thereby turning on the seventh transistor T7 and the eighth transistor T8, the potentials of the first node N1 and the output terminal OP are respectively pulled down to the low level input by the first voltage terminal VGL, thereby further eliminating the noise that may be generated at the output terminal and the first node N1 of the shift register unit in a non-output phase.

When the above-mentioned shift register unit operates, in the first phase S1, only in a case where the fifth transistor T5 and the sixth transistor T6 satisfy a certain configuration relationship (for example, the size ratio of the two transistors satisfies a certain configuration relationship), the potential of the third node N3 may be pulled down to a low level. If the potential of the third node N3 cannot completely turn off the third transistor T3, the high-level signal of the second voltage terminal VDD will charge the second node N2, thereby causing the seventh transistor T7 to be partially turned on, which will affect the charging process of the first node N1, and can affect the normal output of the output terminal OP in severe cases.

That is to say, when the shift register unit shown in FIG. 1A operates, there is a competitive relationship between the charging and discharging of the first node N1, which may cause insufficient charging of the first node N1; in addition, with the accumulation of use time, the threshold voltages of the respective transistors in the shift register unit may drift, and the drift amounts of the threshold voltages of the respective transistors may be different, which will also affect the above competition relationship, thereby affecting the charging process of the first node N1 and thus affecting the product life.

At least one embodiment of the present disclosure provides a shift register unit, the shift register unit can avoid a competitive relationship between the charging and discharging of the first node, so that the charging of the first node is more sufficient, and furthermore, the reliability of the product using the shift register unit can be improved. In addition, the first node and the output terminal can also be reset during a period of time between two display frames to reduce the influence of noise, so that the reliability of the product using the shift register unit can be improved.

In addition, at least one embodiment of the present disclosure further provides a display substrate including the above-mentioned shift register unit. By reasonably arranging the transistors and connection lines in the shift register unit, the layout of the display substrate can be made more compact, so that the area occupied by the peripheral region in the display substrate can be reduced, thereby reducing a frame size of a display device including the display substrate.

The embodiments of the present disclosure and examples thereof will be described in detail below with reference to the accompanying drawings.

At least one embodiment of the present disclosure provides a shift register unit 200, the shift register units may be cascaded to form a gate drive circuit, the gate drive circuit may be used in a display substrate, such as driving a plurality of rows of pixel units in a display region of the display substrate to perform scanning display.

Figure 2A:
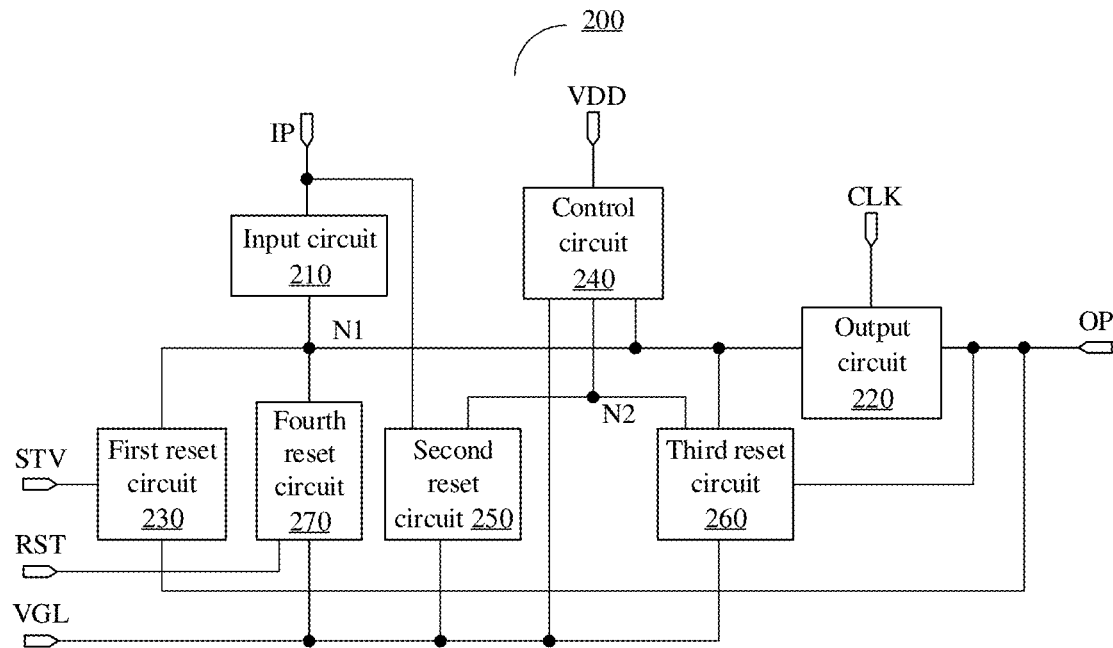
FIG. 2A is a schematic diagram of a shift register unit according to at least one embodiment of the present disclosure.
Figure 2B:
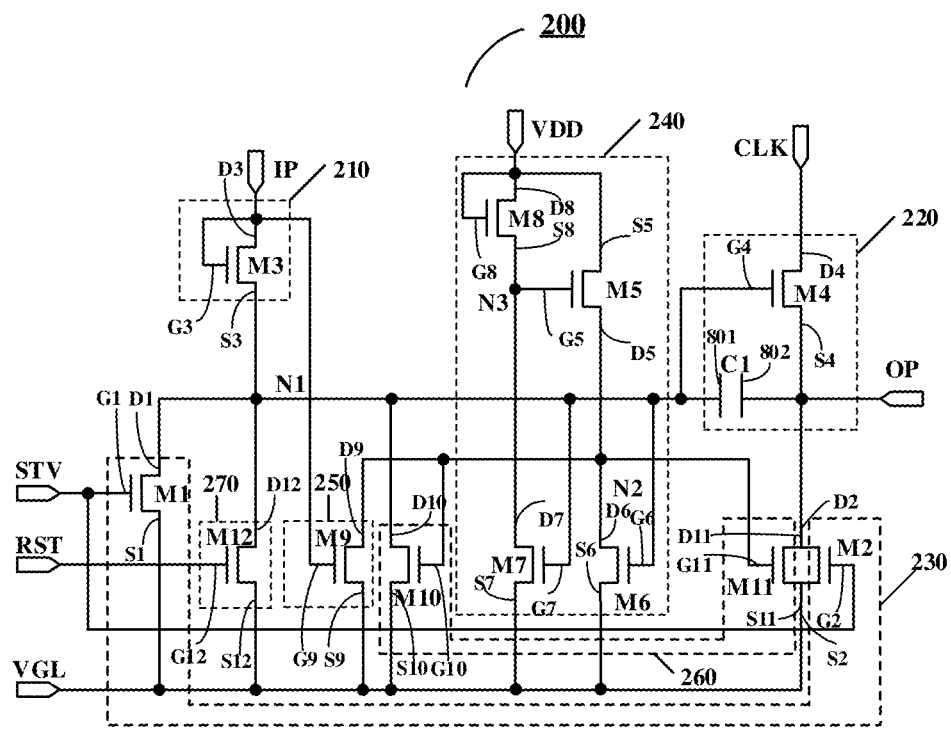
FIG. 2B is a schematic circuit diagram of a shift register unit according to at least one embodiment of the present disclosure.

As shown in FIG. 2A and FIG. 2B, the shift register unit 200 includes an input circuit 210, an output circuit 220, a first reset circuit 230, a control circuit 240, a second reset circuit 250, a third reset circuit 260, and a fourth reset circuit 270.

The input circuit 210 is configured to control the level of the first node N1 in response to the input signal. For example, in the embodiment of the present disclosure, the first node N1 may be a pull-up node (PU). For example, as shown in FIG. 2A, the input circuit 210 is electrically connected to the input terminal IP, so that when the input circuit 210 is turned on, the level of the first node N1 may be controlled by using the input signal input from the input terminal IP, for example, pulling up the level of the first node N1.

For example, as shown in FIG. 2B, the input circuit 210 includes a third transistor M3. A gate electrode G3 of the third transistor M3 and a first electrode D3 of the third transistor M3 are electrically connected, and both are electrically connected to the input terminal IP to receive the input signal; and a second electrode S3 of the third transistor M3 is electrically connected to the first node N1.

The output circuit 220 is configured to receive a clock signal and output the clock signal as an output signal to an output terminal OP under control of the level of the first node. For example, as shown in FIG. 2A, the output circuit 220 is electrically connected to the clock signal terminal CLK and the output terminal OP, and when the output circuit 220 is turned on, the clock signal received from the clock signal terminal CLK may be output to the output terminal OP as an output signal.

For example, as shown in FIG. 2B, the output circuit 220 includes a fourth transistor M4 and a first capacitor C1. A gate electrode G4 of the fourth transistor M4 is electrically connected to the first node N1, a first electrode D4 of the fourth transistor M4 is electrically connected to the clock signal terminal CLK to receive the clock signal, and a second electrode S4 of the fourth transistor M4 is electrically connected to the output terminal OP. A first electrode 801 of the first capacitor C1 is electrically connected to the first node N1, and a second electrode 802 of the first capacitor C1 is electrically connected to the output terminal OP.

The first reset circuit 230 is configured to reset the first node N1 and the output terminal OP during a period of time between two display frames of the display substrate in response to the frame reset signal. For example, as shown in FIG. 2A, the first reset circuit 230 is electrically connected to the frame reset signal terminal STV to receive the frame reset signal, and the first reset circuit 230 is electrically connected to the first voltage terminal VGL to receive the first voltage. For example, the first voltage may be a low level voltage. In addition, the first reset circuit 230 is also electrically connected to the first node N1 and the output terminal OP. During the period of time between two adjacent display frames of the display substrate, when the first reset circuit 230 is turned on in response to the frame reset signal, the first reset circuit 230 may use the low-level first voltage to perform reset operation on the first node N1 and the output terminal OP, respectively, so that the noise on the first node N1 and the output terminal OP can be reduced or eliminated, and the reliability of the product using the shift register unit 200 can be improved.

For example, as shown in FIG. 2B, the first reset circuit 230 includes a first transistor M1 and a second transistor M2. A gate electrode G1 of the first transistor M1 is electrically connected to the frame reset signal terminal STV to receive the frame reset signal, a first electrode D1 of the first transistor M1 is electrically connected to the first node N1, and a second electrode S1 of the first transistor M1 is electrically connected to the first voltage terminal VGL to receive a low-level first voltage. The gate electrode G2 of the second transistor M2 is electrically connected to the frame reset signal terminal STV to receive the frame reset signal, the first electrode D2 of the second transistor M2 is electrically connected to the output terminal OP, and the second electrode S2 of the second transistor M2 is electrically connected to the first voltage terminal VGL to receive the low-level first voltage.

For example, the first node N1 is a junction point of the second electrode S3 of the third transistor M3, the first electrode D1 of the first transistor M1, and the gate electrode G4 of the fourth transistor M4.

The control circuit 240 is configured to control the level of the second node N2 according to the level of the first node N1. For example, in the embodiment of the present disclosure, the second node N2 may be a pull-down node (PD). For example, as shown in FIG. 2A, the control circuit 240 is electrically connected to the first voltage terminal VGL to receive the low-level first voltage; the control circuit 240 is electrically connected to the second voltage terminal VDD to receive a second voltage different from the first voltage, for example, the second voltage may be a high level voltage. In addition, the control circuit 240 is also electrically connected to the first node N1 and the second node N2. For example, when the level of the first node N1 is a high level, the control circuit 240 controls the level of the second node N2 to be a low level; when the level of the first node N1 is a low level, the control circuit 240 may control the level of the second node N2 to be a high level in combination with the high-level second voltage received from the second voltage terminal VDD.

For example, as shown in FIG. 2B, the control circuit 240 includes a fifth transistor M5, a sixth transistor M6, a seventh transistor M7, and an eighth transistor M8. A gate electrode G8 of the eighth transistor M8 and a first electrode D8 of the eighth transistor M8 are electrically connected, and both are electrically connected to the second voltage terminal VDD to receive a high-level second voltage; a second electrode S8 of the eighth transistor M8 is electrically connected to the third node N3, for example, the third node N3 may be a pull-down control node (PD_CN). A gate electrode G7 of the seventh transistor M7 is electrically connected to the first node N1, a first electrode D7 of the seventh transistor M7 is electrically connected to the third node N3, and a second electrode S7 of the seventh transistor M7 is electrically connected to the first voltage terminal VGL to receive the low-level first voltage. A gate electrode G5 of the fifth transistor M5 is electrically connected to the third node N3, a first electrode D5 of the fifth transistor M5 is electrically connected to the second node N2, and a second electrode S5 of the fifth transistor M5 is electrically connected to the second voltage terminal VDD to receive the high-level second voltage. A gate electrode of the sixth transistor M6 is electrically connected to the first node N1, a first electrode D6 of the sixth transistor M6 is electrically connected to the second node N2, and a second electrode S6 of the sixth transistor M6 is electrically connected to the first voltage terminal VGL to receive the low-level first voltage.

For example, the second node N2 is a junction node of the first electrode D5 of the fifth transistor M5 and the first electrode D6 of the sixth transistor M6; the third node N3 is a junction node of the second electrode S8 of the eighth transistor M8, the gate electrode G5 of the fifth transistor M5, and the first electrode D7 of the seventh transistor M7.

It should be noted that, in the embodiments of the present disclosure, the respective nodes (the first node N1, the second node N2, the third node N3) and the respective signal terminals (the input terminal IP, the output terminal OP, the frame reset signal terminal STV, the scan reset signal terminal RST, the clock signal terminal CLK, etc.) are provided to better describe the circuit structure, and do not represent actual components. The node represents a junction node where the related circuits in the circuit structure are connected, that is, the related circuits connected with the same node identifier are electrically connected to each other.

The second reset circuit 250 is configured to control the level of the second node N2 in response to the input signal. For example, as shown in FIG. 2A, the second reset circuit 250 is electrically connected to the input terminal IP to receive the input signal, and the second reset circuit 250 is also electrically connected to the first voltage terminal VGL to receive the low-level first voltage. In addition, the second reset circuit 250 is also electrically connected to the second node N2. For example, when the input circuit 210 uses the input signal to charge the first node N1, the second reset circuit 250 may be turned on in response to the input signal, so that the level of the second node N2 may be controlled by using the low-level first voltage, for example, the potential of the second node N2 may be pulled down to a low level.

In the shift register unit 200 provided by the above embodiments of the present disclosure, by setting the second reset circuit 250, the potential of the second node N2 does not affect the charging process of the first node N1, so that the first node N1 can be charged more sufficiently, the reliability of the product using the shift register unit 200 can be improved.

For example, as shown in FIG. 2B, the second reset circuit 250 includes a ninth transistor M9. A gate electrode G9 of the ninth transistor M9 is electrically connected to the input terminal IP to receive the input signal, a first electrode D9 of the ninth transistor M9 is electrically connected to the second node N2, and a second electrode S9 of the ninth transistor M9 is electrically connected to the first voltage terminal VGL to receive the low-level first voltage.

The third reset circuit 260 is configured to reset the first node N1 and the output terminal OP under the control of the level of the second node N2. For example, as shown in FIG. 2A, the third reset circuit 260 is electrically connected to the first voltage terminal VGL to receive the low-level first voltage. In addition, the third reset circuit 260 is also electrically connected to the first node N1, the second node N2, and the output terminal OP. For example, when the third reset circuit 260 is turned on under the control of the level of the second node N2 (for example, the level of the second node N2 is a high level), the first node N1 and the output terminal OP may be respectively reset by using the low-level first voltage, so that the noise on the first node N1 and the output terminal OP can be reduced or eliminated.

For example, as shown in FIG. 2B, the third reset circuit 260 includes a tenth transistor M10 and an eleventh transistor M11. A gate electrode G10 of the tenth transistor M10 is electrically connected to the second node N2, a first electrode D10 of the tenth transistor M10 is electrically connected to the first node N1, and a second electrode S10 of the tenth transistor M10 is electrically connected to the first voltage terminal VGL to receive the low-level first voltage. A gate electrode G11 of the eleventh transistor M11 is electrically connected to the second node N2, a first electrode D11 of the eleventh transistor M11 is electrically connected to the output terminal OP, and a second electrode S11 of the eleventh transistor M11 is electrically connected to the first voltage terminal VGL to receive the low-level first voltage.

The fourth reset circuit 270 is configured to reset the first node N1 in response to the scan reset signal, for example, pulling down the level of the first node N1, thereby reducing noise that may exist on the first node N1. For example, as shown in FIG. 2A, the fourth reset circuit 270 is electrically connected to the scan reset signal terminal RST to receive the scan reset signal, and is electrically connected to the first voltage terminal VGL to receive the low-level first voltage. In addition, the fourth reset circuit 270 is also electrically connected to the first node N1. For example, when the fourth reset circuit 270 is turned on in response to the scan reset signal, the first node N1 may be reset by using the low-level first voltage, thereby pulling down the level of the first node N1.

For example, as shown in FIG. 2B, the fourth reset circuit 270 includes a twelfth transistor M12. A gate electrode G12 of the twelfth transistor M12 is electrically connected to the scan reset signal terminal RST to receive the scan reset signal, a first electrode D12 of the twelfth transistor M12 is electrically connected to the first node N1, and a second electrode S12 of the twelfth transistor M12 is electrically connected to the first voltage terminal VGL to receive the low-level first voltage.

It should be noted that, in the above description of the connection relationship in the shift register unit 200 shown in FIG. 2B, "electrically connected" is used. Here, two components being "electrically connected" indicates that the two components are electrically connected, including directly connected and indirectly connected, that is, in the corresponding layout diagram, the two components can be directly connected (for example, integrally formed) to achieve electrical connection, or the two components may be electrically connected through other components disposed between the two components.

The transistors used in the embodiments of the present disclosure may all be thin film transistors, field effect transistors, or other switching devices with the same characteristics, and the embodiments of the present disclosure are described by taking the thin film transistor as an example. The source electrode and the drain electrode of the transistor used here may be symmetrical in structure, so the source electrode and the drain electrode of the transistor may be indistinguishable in structure. In the embodiments of the present disclosure, in order to distinguish the two electrodes (i.e., the source electrode and the drain electrode) of the transistor other than the gate electrode, one of the two electrodes is directly described as a first electrode and the other of the two electrodes is directly described as a second electrode. In addition, the transistors may be divided into N-type transistors and P-type transistors according to characteristics of the transistors. When the transistor is a P-type transistor, the turn-on voltage is a low-level voltage (e.g., 0V, −5V, −10V, or other suitable voltages), and the turn-off voltage is a high-level voltage (e.g., 5V, 10V, or other suitable voltages); when the transistor is an N-type transistor, the turn-on voltage is a high-level voltage (e.g., 5V, 10V, or other suitable voltages), and the turn-off voltage is a low-level voltage (e.g., 0V, −5V, −10V, or other suitable voltages).

In addition, it should be noted that in the embodiments of the present disclosure, the high level and the low level are relative. The high level represents a relatively high voltage range (for example, the high level can be 5V, 10V, or other suitable voltages), and a plurality of high levels may be the same or different. Similarly, the low level represents a relatively low voltage range (for example, the low level can be 0V, −5V, −10V, or other suitable voltages), and a plurality of low levels may be the same or different. For example, the minimum value of a high level is greater than the maximum value of a low level.

Figure 3:
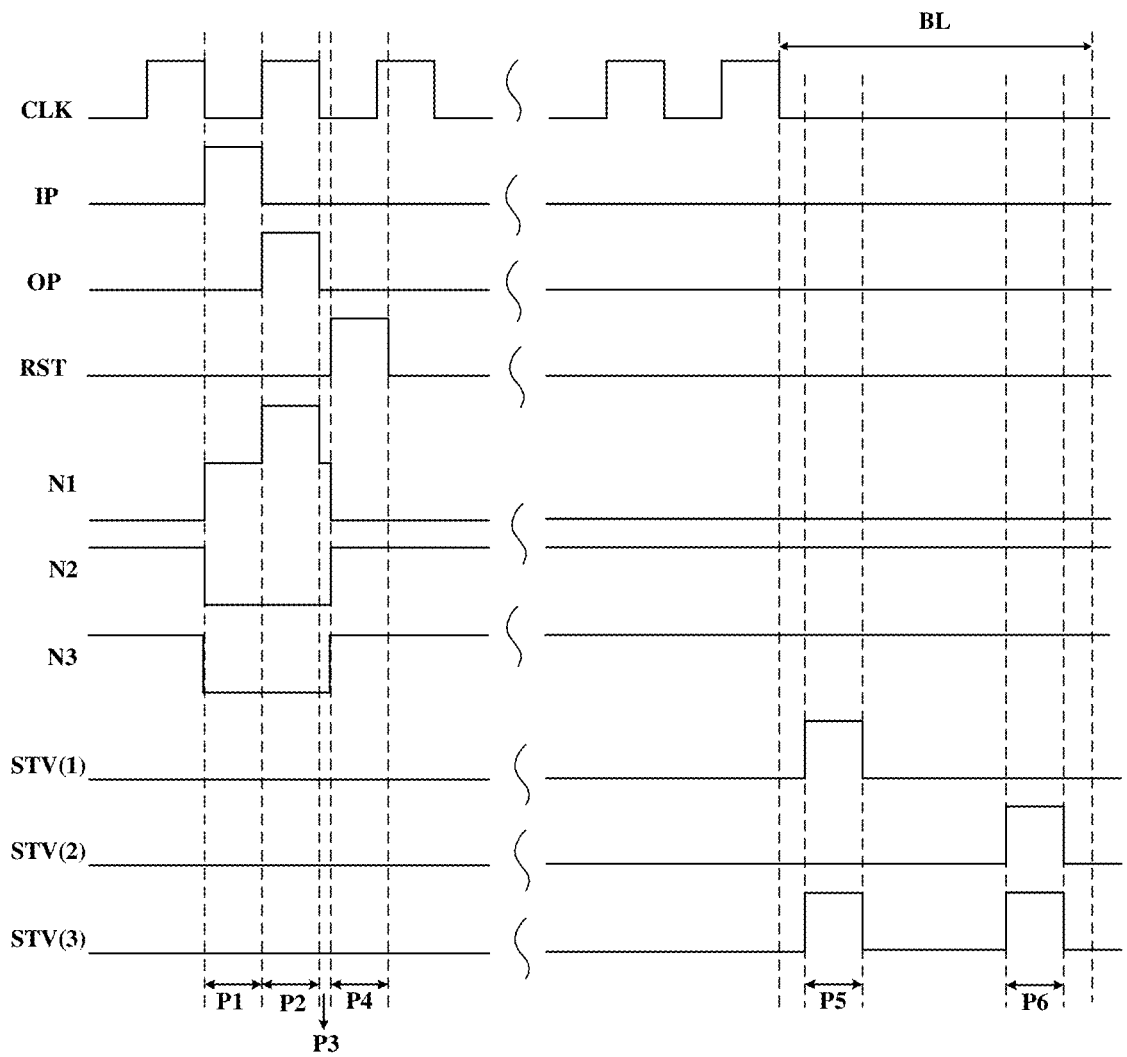
FIG. 3 is a signal timing diagram corresponding to the shift register unit shown in FIG. 2B during operation.

The working principle of the shift register unit 200 shown in FIG. 2B will be described below in conjunction with the signal timing diagram shown in FIG. 3, in total six phases including a first phase P1, a second phase P2, a third phase P3, a fourth phase P4, a fifth phase P5, and a sixth phase P6 shown in FIG. 3, the shift register unit 200 operates as follows. It should be noted that the potentials in the signal timing diagram shown in FIG. 3 are only schematic and do not represent real potential values.

In the first phase P1, the clock signal terminal CLK inputs a low-level signal, and the input terminal IP inputs a high-level signal. Because the input terminal IP inputs a high-level signal, the third transistor M3 is turned on, so that the high level input from the input terminal IP charges the first capacitor C1, and the potential of the first node N1 is pulled up to the first high level.

Because the second voltage terminal VDD is configured to be connected to the DC high-level signal, the eighth transistor M8 is kept to be turned on, and the high level signal input from the second voltage terminal VDD charges the third node N3. Because the potential of the first node N1 is the first high level, the seventh transistor M7 is turned on, so that the third node N3 is electrically connected to the first voltage terminal VGL. In terms of designing the transistor, the eighth transistor M8 and the seventh transistor M7 may be configured (for example, for the size ratio, threshold voltages, etc. of the two transistors) such that when both the eighth transistor M8 and the seventh transistor M7 are turned on, the potential of the third node N3 is pulled down to a low level, and the low level does not fully turn on the fifth transistor M5. Because the potential of the first node N1 is the first high level, the sixth transistor M6 is turned on, so that the potential of the second node N2 is pulled down to a low level.

In addition, because the input terminal IP inputs a high-level signal, the ninth transistor M9 is turned on, and the turned-on ninth transistor M9 may use the low-level first voltage to pull down the potential of the second node N2 to a low level.

Because the first node N1 is at the first high level, the fourth transistor M4 is turned on, and the clock signal terminal CLK inputs a low level at this time, so that in this phase, the output terminal OP outputs the low level.

As described above, when the shift register unit 200 shown in FIG. 2B operates in the first phase S1, even if the control circuit 240 cannot completely pull down the potential of the second node N2 to a low level, the second reset circuit 250, that is, the ninth transistor M9, may also directly pull down the potential of the second node N2 to a low level, so as to ensure that the potential of the second node N2 will not affect the charging process of the first node N1, and therefore, the charging of the first node N1 can be more sufficient, and the reliability of the product using the shift register unit 200 can be improved.

In the second phase P2, a high-level signal is input to the clock signal terminal CLK, and a low-level signal is input to the input terminal IP. Because the input terminal IP inputs the low-level signal, the third transistor M3 is turned off, the first node N1 keeps at the first high level of the previous phase, so that the fourth transistor M4 is kept on. Because the clock signal terminal CLK inputs the high level in this phase, the output terminal OP outputs the high level.

At the same time, because the clock signal terminal CLK and the output terminal OP are at a high level, the high level may increase, by coupling, the potential of the first node N1 to the second high level through the parasitic capacitor of the fourth transistor M4 (including the parasitic capacitor between the gate electrode and the first electrode of the fourth transistor M4 and the parasitic capacitor between the gate electrode and the second electrode of the fourth transistor M4) and the first capacitor C1, so that the fourth transistor M4 is turned on more sufficiently. Because the potential of the first node N1 is a high level, the sixth transistor M6 continues to be turned on, so that the potential of the second node N2 is kept at a low level.

In the third phase P3, the signal input from the clock signal terminal CLK changes from a high level to a low level, and the low level is output to the output terminal OP through the turned-on fourth transistor M4. In addition, the level change of the clock signal terminal CLK will pull down, by coupling, the potential of the first node N1 to the first high level through the parasitic capacitor of the turned-on fourth transistor M4 and the first capacitor C1.

In the fourth phase P4, because the scan reset signal terminal RST inputs a high-level signal, the twelfth transistor M12 is turned on, so that the first node N1 is electrically connected to the first voltage terminal VGL, and the potential of the first node N1 is pulled down to a low level, so that the fourth transistor M4 is turned off.

Because the potential of the first node N1 is at a low level, the sixth transistor M6 and the seventh transistor M7 are turned off, the discharge paths of the third node N3 and the second node N2 are cut off, and the potential of the second node N2 is charged to a high level, thereby turning on the tenth transistor M10 and the eleventh transistor M11, so as to respectively pull down the potential of the first node N1 and the potential of the output terminal OP to the low level input by the first voltage terminal VGL, thereby further eliminating the noise that may be generated at the output terminal OP and the first node N1 of the shift register unit 200 in the non-output phase, and improving the reliability of the product using the shift register unit 200.

In the fifth phase P5 or the sixth phase P6, because the frame reset signal terminal STV inputs a high-level signal, the first transistor M1 and the second transistor M2 are turned on, so that the first node N1 and the output terminal OP may be reset respectively by using the low-level first voltage, and therefore, the noise at the first node N1 and the output terminal OP can be reduced or eliminated, so that the reliability of the product using the shift register unit 200 can be improved.

It should be noted that the fifth phase P5 and the sixth phase P6 are within the period of time BL between two display frames, for example, the fifth phase P5 is closer to a current frame than the sixth phase P6, and the sixth phase P6 is closer to a next frame than the fifth phase P5. Three examples of three frame reset signals, namely STV(1), STV(2), and STV(3), are shown in FIG. 3. That is, the first reset circuit 230 in the shift register unit 200 can reset the first node N1 and the output terminal OP only in the fifth phase P5, alternatively, the first node N1 and the output terminal OP may be reset only in the sixth phase P6, or, the first node N1 and the output terminal OP may be reset simultaneously in the fifth phase P5 and the sixth phase P6.

In addition, it should be noted that the positions of the fifth phase P5 and the sixth phase P6 in the period of time BL in FIG. 3 are only schematic, and the embodiments of the present disclosure include but are not limited thereto; during the period of time BL in FIG. 3, more reset operations may be performed on the first node N1 and the output terminal OP, however, the embodiment of the present disclosure are not limited thereto.

Figure 4A:
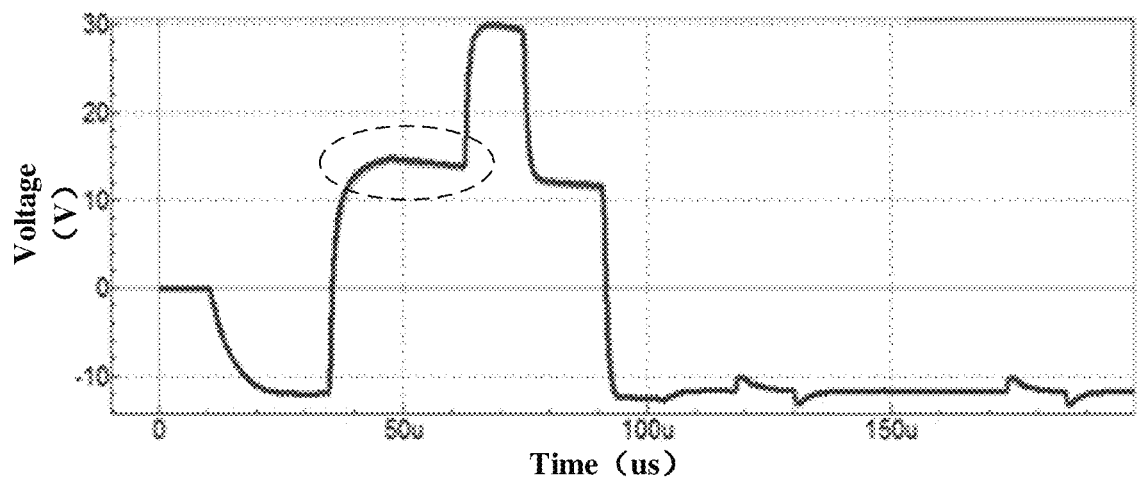
FIG. 4A is a simulation diagram of a potential of a first node in the shift register unit shown in FIG. 1A and a potential of a first node in the shift register unit shown in FIG. 2B.
Figure 4B:
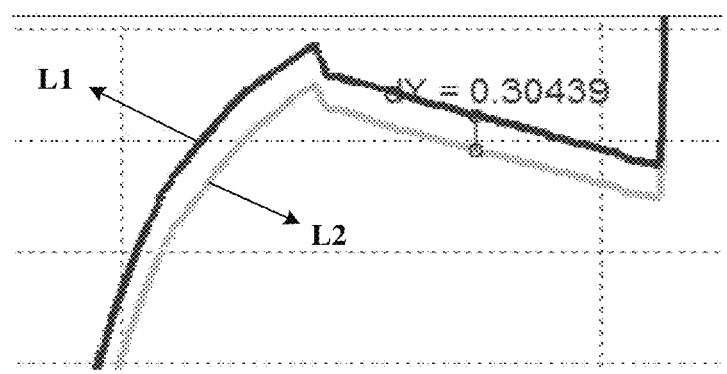
FIG. 4B is a schematic diagram after enlarging a part enclosed by a dotted-line ellipse in FIG. 4A.

The potential of the first node N1 in the shift register unit shown in FIG. 1A and the potential of the first node N1 in the shift register unit 200 shown in FIG. 2B are simulated, and the simulation results are shown in FIG. 4A and FIG. 4B. It should be noted that, in FIG. 4A, because there are many overlapping parts of the two curves, the part enclosed by the dotted-line ellipse in FIG. 4A is enlarged and shown in FIG. 4B.

As shown in FIG. 4B, the curve L1 is a simulated variation curve corresponding to the potential of the first node N1 in the shift register unit 200 shown in FIG. 2B, and the curve L2 is a simulated variation curve corresponding to the potential of the first node N1 in the shift register unit shown in FIG. 1A. It can be seen from FIG. 4B that the potential of the first node N1 in the shift register unit 200 shown in FIG. 2B is higher than the potential of the first node N1 in the shift register unit shown in FIG. 1A, and the difference dY is dY=0.30439V. That is, compared with the shift register unit shown in FIG. 1A, the shift register unit 200 shown in FIG. 2B can make the charging of the first node N1 more sufficient, so that the potential of the first node N1 is higher, and therefore, the reliability of the product using the shift register unit 200 can be improved.

Figure 5A:
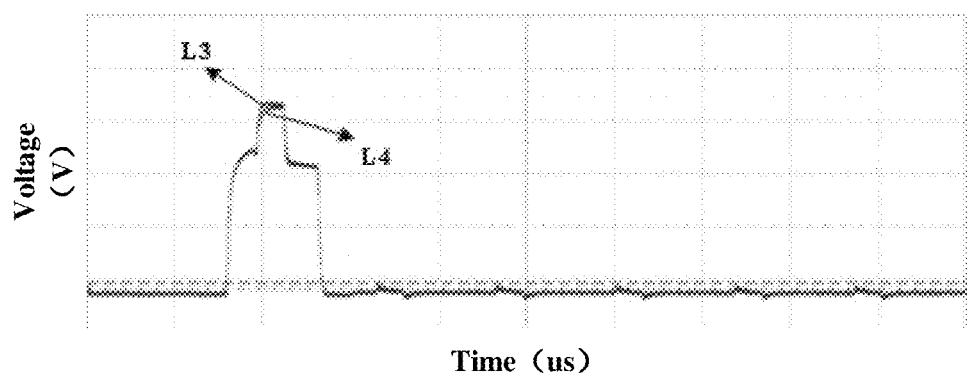
FIG. 5A is a test result of actually testing the potential of the first node in the shift register unit shown in FIG. 1A and the potential of the first node in the shift register unit shown in FIG. 2B.

FIG. 5A is a test result of actually testing the potential of the first node in the shift register unit shown in FIG. 1A and the potential of the first node N1 in the shift register unit 200 shown in FIG. 2B. The curve L3 is a test variation curve corresponding to the potential of the first node N1 in the shift register unit 200 shown in FIG. 2B, and the curve L4 is a test variation curve corresponding to the potential of the first node N1 in the shift register unit shown in FIG. 1A. It can be seen from FIG. 5A that the potential of the first node N1 in the shift register unit 200 shown in FIG. 2B is higher than the potential of the first node N1 in the shift register unit shown in FIG. 1A.

Figure 5B:
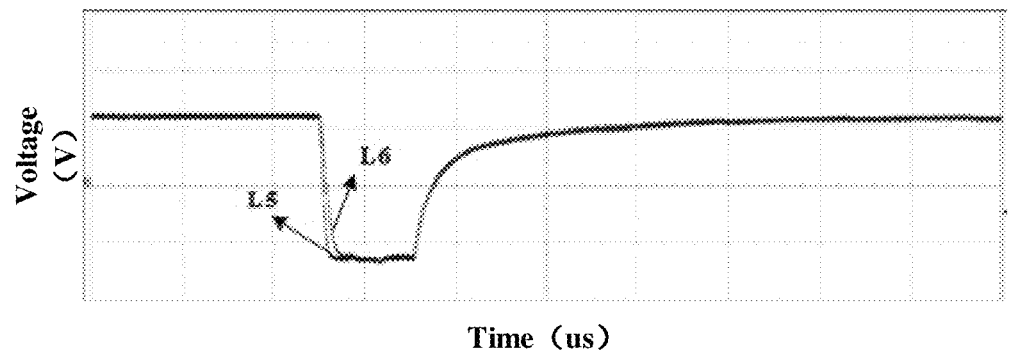
FIG. 5B is a test result of actually testing a potential of a second node in the shift register unit shown in FIG. 1A and a potential of a second node in the shift register unit shown in FIG. 2B.

FIG. 5B is a test result of actually testing the potential of the second node N2 in the shift register unit shown in FIG. 1A and the potential of the second node N2 in the shift register unit 200 shown in FIG. 2B. The curve L5 is a test variation curve corresponding to the potential of the second node N2 in the shift register unit 200 shown in FIG. 2B, and the curve L6 is a test variation curve corresponding to the potential of the second node N2 in the shift register unit shown in FIG. 1A. It can be seen from FIG. 5B, compared with the potential of the second node N2 in the shift register unit shown in FIG. 1A, the potential of the second node N2 in the shift register unit 200 shown in FIG. 2B can be pulled down to a low level faster, thereby reducing the influence of the potential of the second node N2 on the potential of the first node N1, so that the charging of the first node N1 is more sufficient, and the reliability of the product using the shift register unit 200 can be improved.

A plurality of shift register units 200 as shown in FIG. 2B may be cascaded to form a gate drive circuit, and the gate drive circuit may drive a plurality of rows of pixel units in the display region of the display substrate to perform scanning display in sequence.

Figure 6:
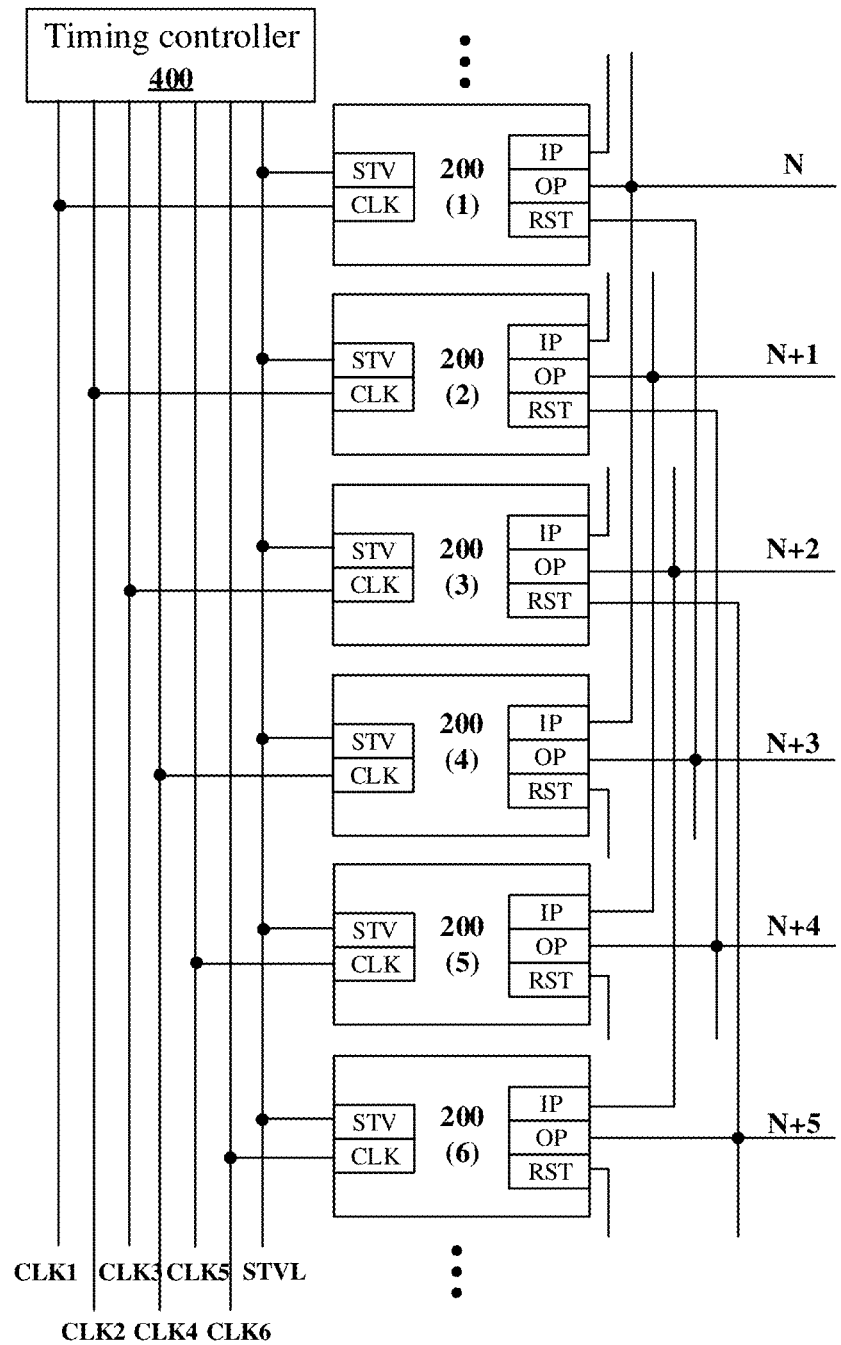
FIG. 6 shows a schematic diagram that a plurality of shift register units as shown in FIG. 2B are cascaded.

FIG. 6 shows a schematic diagram that a plurality of shift register units 200 as shown in FIG. 2B are cascaded. It should be noted that, FIG. 6 only schematically shows six shift register units 200, for example, a first shift register unit 200(1), a second shift register unit 200(2), a third shift register unit 200(3), a fourth shift register unit 200(4), a fifth shift register unit 200(5), and a sixth shift register unit 200(6). For example, the output signals of the six shift register units 200 are respectively provided to an N-th row, a (N+1)-th row, a (N+2)-th row, a (N+3)-th row, a (N+4)-th row, and a (N+5)-th row of the pixel units in the display region to drive the pixel units to perform scanning display. For example, N is an integer greater than or equal to 1.

In the example shown in FIG. 6, the output terminal OP of the first shift register unit 200(1) is electrically connected to the input terminal IP of the fourth shift register unit 200(4), so that the output signal of the first shift register unit 200(1) is provided to the fourth shift register unit 200(4) as an input signal; the output terminal OP of the second shift register unit 200(2) is electrically connected to the input terminal IP of the fifth shift register unit 200(5), so that the output signal of the second shift register unit 200(2) is provided to the fifth shift register unit 200(5) as an input signal; the output terminal OP of the third shift register unit 200(3) is electrically connected to the input terminal IP of the sixth shift register unit 200(6), so that the output signal of the third shift register unit 200(3) is provided to the sixth shift register unit 200(6) as an input signal; and so on, the other shift register units included in the gate drive circuit may also be cascaded in this way, and the redundancy portions are not repeated here.

In the above gate drive circuit, the output terminal OP of the n-th stage shift register unit is electrically connected to the input terminal IP of the (n+3)-th stage shift register unit, so that the output signal of the n-th stage shift register unit is provided to the (n+3)-th stage shift register unit as an input signal; n is an integer greater than or equal to 1. By analogy, the other shift register units included in the gate drive circuit may also be cascaded in this way, which is not repeated here.

In addition, it should be noted that, in the cascade mode shown in FIG. 6, the input terminals of the first three shift register units of the gate drive circuit may receive separate input signals.

In the example shown in FIG. 6, the scan reset signal terminal RST of the first shift register unit 200(1) is electrically connected to the output terminal OP of the fourth shift register unit 200(4), so that the output signal of the fourth shift register unit 200(4) is provided to the first shift register unit 200(1) as a scan reset signal; the scan reset signal terminal RST of the second shift register unit 200(2) is electrically connected to the output terminal OP of the fifth shift register unit 200(5), so that the output signal of the fifth shift register unit 200(5) is provided to the second shift register unit 200(2) as a scan reset signal; the scan reset signal terminal RST of the third shift register unit 200(3) is electrically connected to the output terminal OP of the sixth shift register unit 200(6), so that the output signal of the sixth shift register unit 200(6) is provided to the third shift register unit 200(3) as a scan reset signal; and so on, the other shift register units included in the gate drive circuit may also be cascaded in this way, which will not be repeated here.

In the above gate drive circuit, the scan reset signal terminal RST of the n-th stage shift register unit is electrically connected to the output terminal OP of the (n+3)-th stage shift register unit, so that the output signal of the (n+3)-th stage shift register unit is provided to the n-th stage shift register unit as a scan reset signal; n is an integer greater than or equal to 1. By analogy, the other shift register units included in the gate drive circuit may also be cascaded in this way, which is not repeated here.

In addition, it should be noted that, in the cascade mode shown in FIG. 6, the reset terminals of the last three shift register units of the gate drive circuit may receive separate scan reset signals.

As shown in FIG. 6, in the case where the gate drive circuit is provided on a display substrate, the display substrate may further include a plurality of signal lines for providing various signals to the gate drive circuit. For example, the plurality of signal lines include six clock signal lines (a first clock signal line CLK1, a second clock signal line CLK2, a third clock signal line CLK3, a fourth clock signal line CLK4, a fifth clock signal line CLKS, and a sixth clock signal line CLK6) providing clock signals and a frame reset signal line STVL providing the frame reset signal. It should be noted that, the display substrate may further include other voltage signal lines, such as voltage signal lines for providing a first voltage or a second voltage, and similar portions will not be repeated here.

For example, as shown in FIG. 6, the first clock signal line CLK1, the second clock signal line CLK2, the third clock signal line CLK3, the fourth clock signal line CLK4, the fifth clock signal line CLKS, and the sixth clock signal line CLK6 are respectively connected to the clock signal terminals CLK of the first shift register unit 200(1), the second shift register unit 200(2), the third shift register unit 200(3), the fourth shift register unit 200(4), the fifth shift register unit 200(5), and the sixth shift register unit 200(6) to provide the required clock signals. In the example shown in FIG. 6, the clock signals used by the gate drive circuit are 6CLK, that is, the clock signals received by every adjacent six shift register units 200 are one cycle.

It should be noted that the clock signals of 6CLK used in FIG. 6 are only schematic, and the gate drive circuit may also use other clock signals such as 2CLK and 4CLK, which is not limited in the embodiments of the present disclosure.

As shown in FIG. 6, the frame reset signal line STVL is electrically connected to the frame reset signal terminals STV of all shift register units 200 in the gate drive circuit. For example, the display substrate may further include a timing controller 400, and the timing controller 400 is electrically connected to the above-mentioned plurality of clock signal lines and the frame reset signal line STVL to provide corresponding signals.

Figure 7:
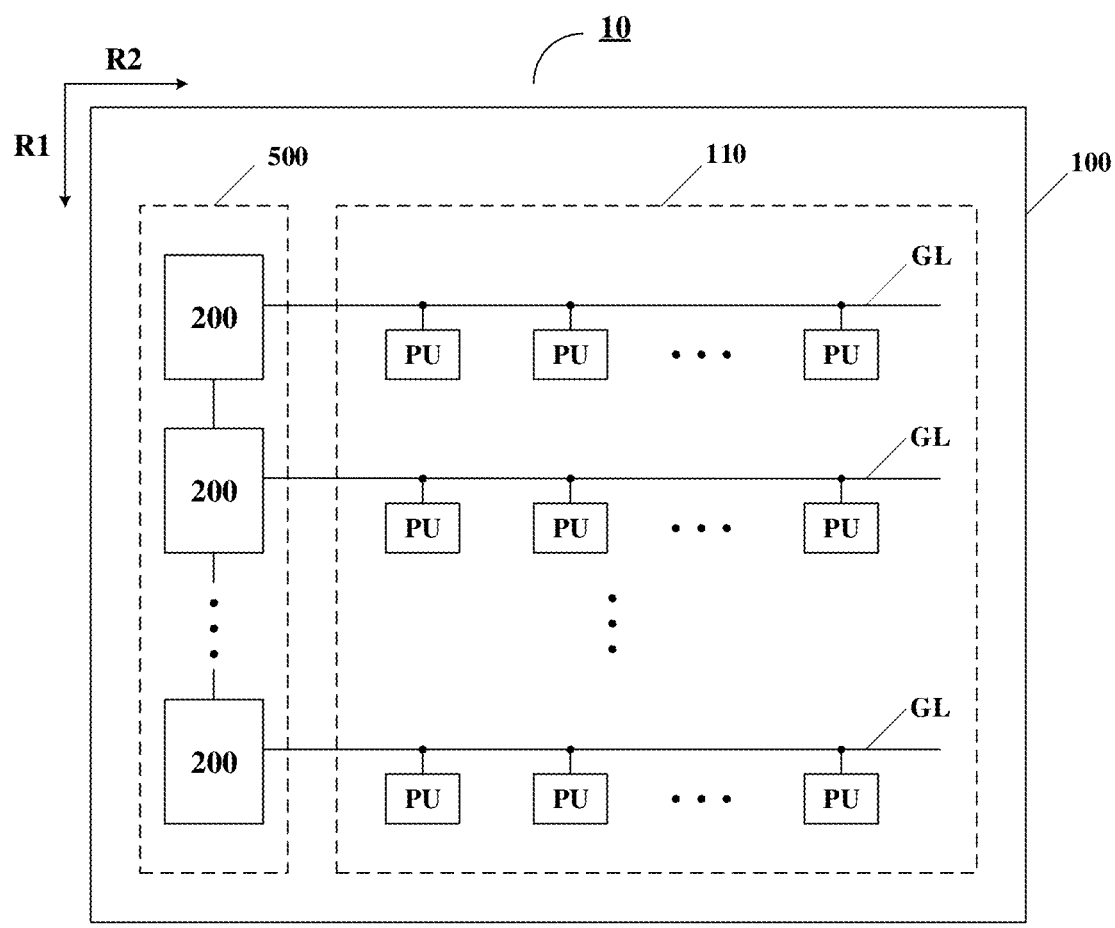
FIG. 7 is a schematic diagram of a display substrate according to at least one embodiment of the present disclosure.

At least one embodiment of the present disclosure also provides a display substrate 10. As shown in FIG. 7, the display substrate 10 includes a base substrate 100 and a plurality of shift register units disposed on the base substrate, for example, the shift register unit may adopt the shift register unit 200 shown in FIG. 2B. The plurality of shift register units 200 are arranged side by side along the first direction RE For example, the plurality of shift register units 200 may be cascaded to form a gate drive circuit 500, the gate drive circuit 500 may drive a plurality of rows of pixel units PU in the display region 110 of the display substrate 10 to perform scanning display. For example, each shift register unit 200 is electrically connected to the pixel units PU of the corresponding row through a gate line GL.

In the embodiments of the present disclosure, for example, the base substrate 100 may be made of, for example, glass, plastic, quartz, or other suitable materials, and the embodiments of the present disclosure do not limit this.

Figure 8:
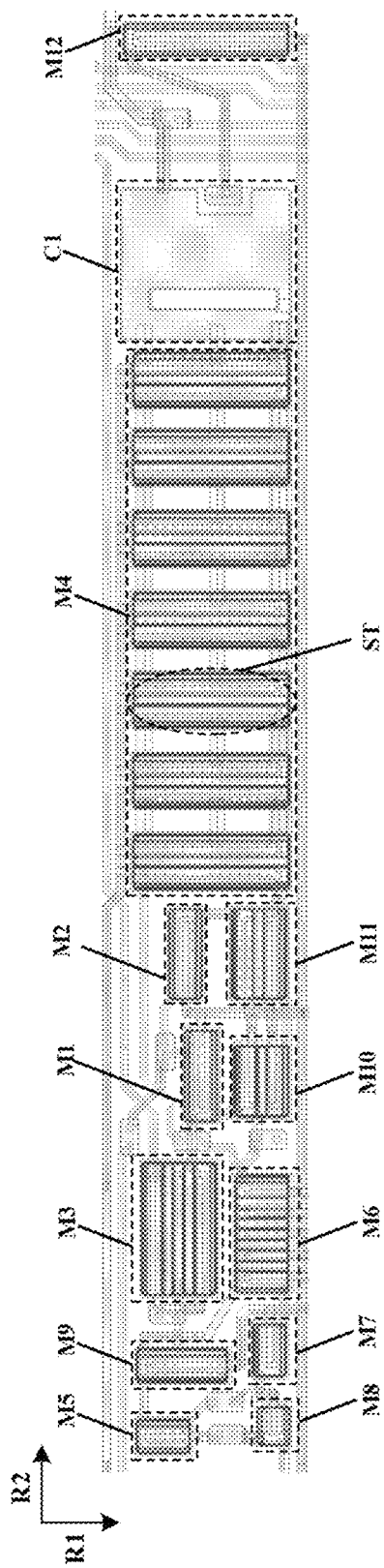
FIG. 8 is a layout diagram corresponding to the shift register unit shown in FIG. 2B.
Figure 9A:
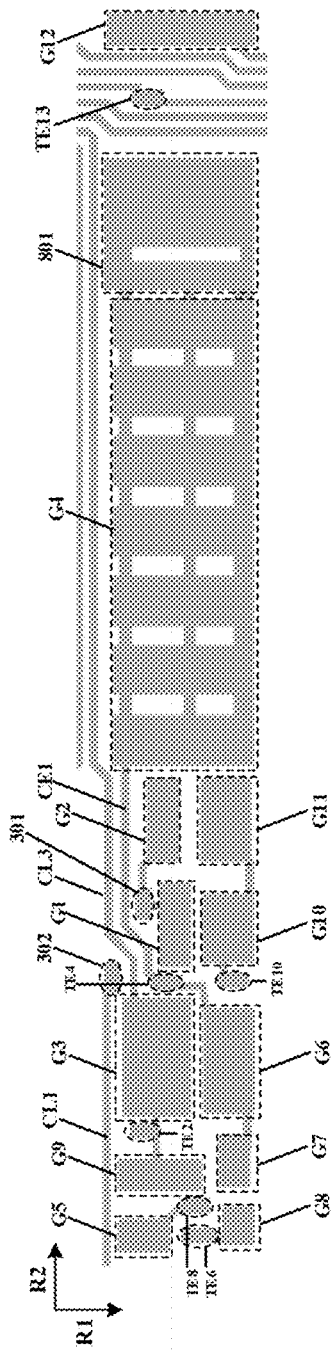
FIG. 9A, FIG. 9B, and FIG. 9C are layout diagrams corresponding to a first conductive layer, a second conductive layer, and a semiconductor layer in FIG. 8, respectively.
Figure 9B:
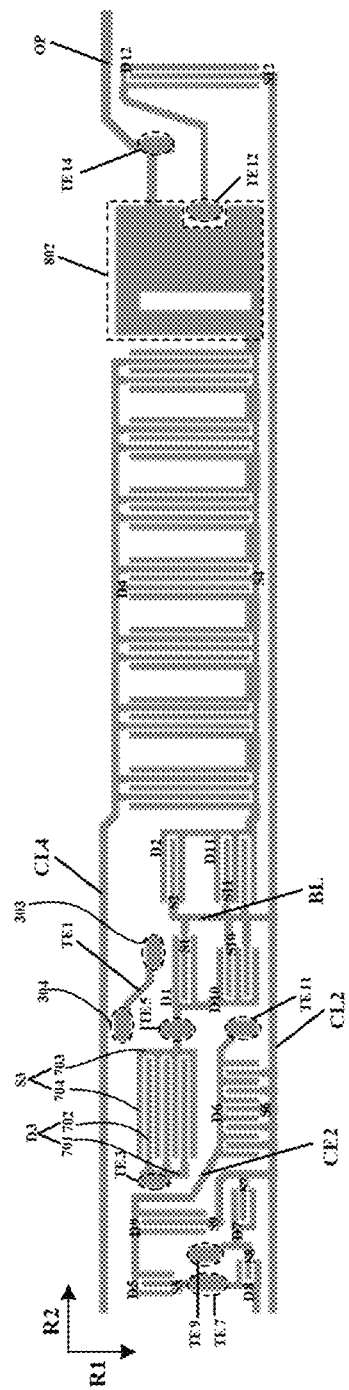
Figure 9C:
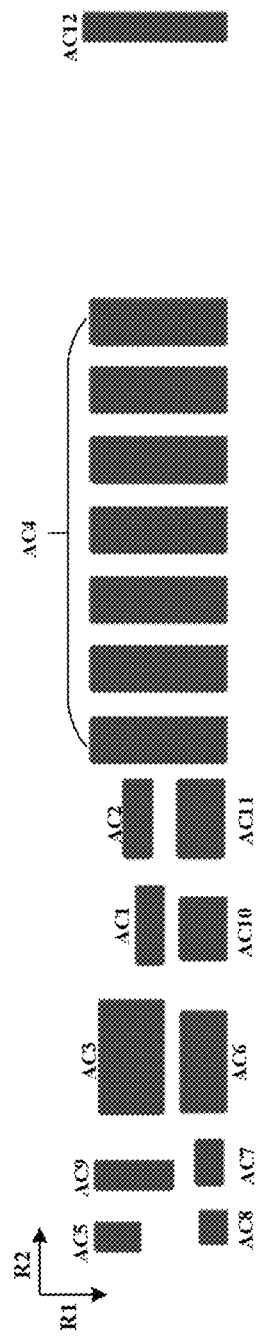
Figure 9D:
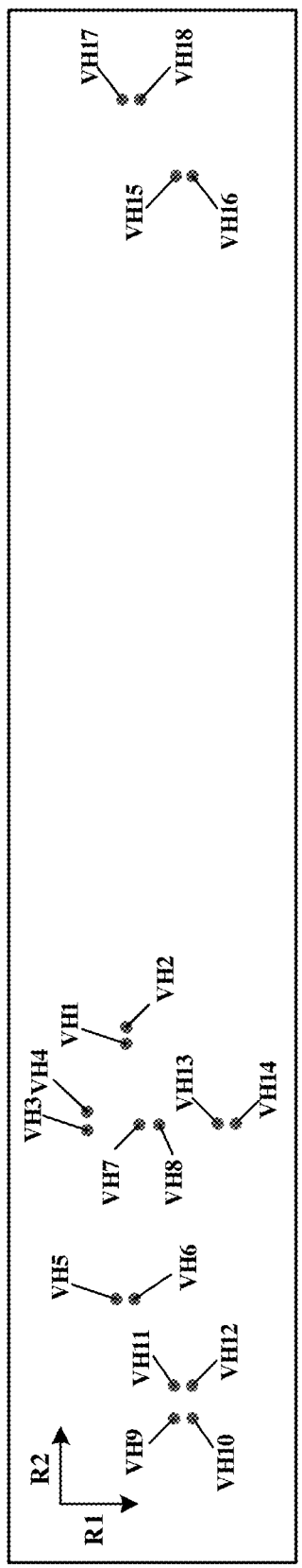
FIG. 9D is a layout diagram of some via holes used in FIG. 8.
Figure 10:
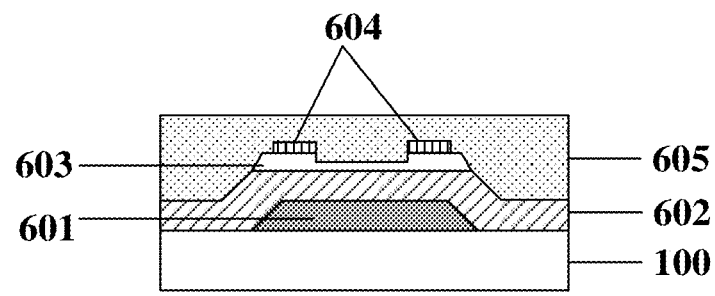
FIG. 10 is a schematic cross-sectional diagram of respective layer structures included in a display substrate according to at least one embodiment of the present disclosure.
Figure 11A:
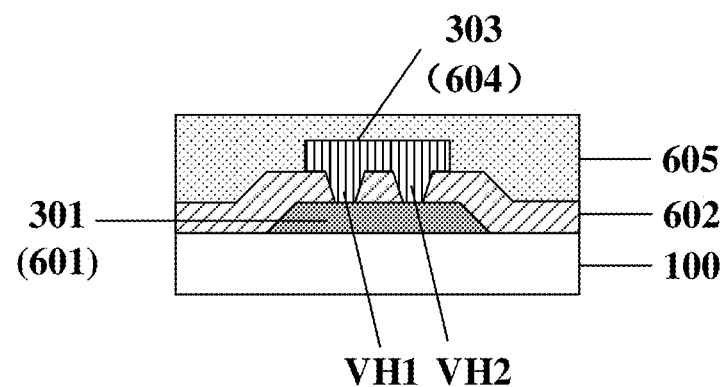
FIG. 11A is a schematic cross-sectional diagram of a display substrate at a position including a via hole according to at least one embodiment of the present disclosure.
Figure 11B:
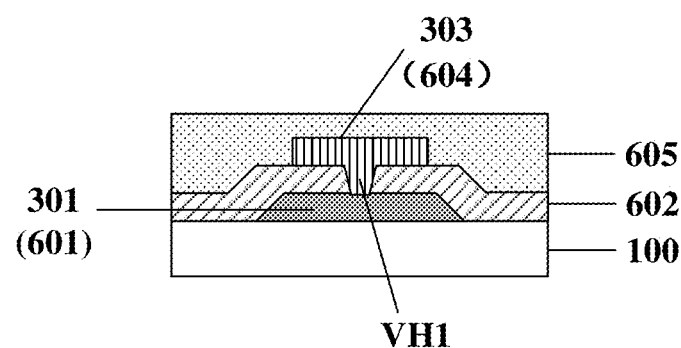
FIG. 11B is a schematic cross-sectional diagram of a display substrate at a position including a via hole according to at least one embodiment of the present disclosure.

FIG. 8 is an exemplary layout diagram corresponding to the shift register unit 200 shown in FIG. 2B; FIG. 9A, FIG. 9B, and FIG. 9C are layout diagrams corresponding to a first conductive layer, a second conductive layer, and a semiconductor layer in FIG. 8, respectively; FIG. 9D is a layout diagram of some via holes used in FIG. 8; FIG. 10 is a schematic cross-sectional diagram of respective layer structures included in the display substrate 10; and FIG. 11A-FIG. 11B are schematic cross-sectional diagrams of the display substrate 10 at the position including the via hole.

For example, as shown in FIG. 10, the respective layer structures included in the display substrate 10 are illustrated by taking a transistor as an example. For example, the display substrate 10 includes a base substrate 100, a first conductive layer 601, a first insulating layer 602, a semiconductor layer 603, a second conductive layer 604, and a second insulating layer 605. For example, a gate electrode of a certain transistor in the shift register unit 200 may be disposed in the first conductive layer 601, the first electrode and the second electrode of the transistor may be disposed in the second conductive layer 604, and the active layer of the transistor may be disposed in the semiconductor layer 603; for example, the first insulating layer 602 may be a gate insulating layer, and the second insulating layer 605 may be a passivation layer. It should be noted that FIG. 10 only schematically shows part of the layer structure, the display substrate 10 may further include other layer structures as required, and the embodiments of the present disclosure are not limited in this aspect.

For example, the materials of the above-mentioned first conductive layer 601 and the above-mentioned second conductive layer 604 may include titanium, titanium alloy, aluminum, aluminum alloy, copper, copper alloy, or any other suitable composite material, and the embodiments of the present disclosure are not limited in this aspect. For example, the material of the first conductive layer 601 may be the same as the material of the second conductive layer 604, and details are not described herein again.

For example, the materials of the first insulating layer 602 and the second insulating layer 605 may include inorganic insulating materials such as SiNx, SiOx, SiNxOy, etc., organic insulating materials such as organic resins, or other suitable materials, and the embodiments of the present disclosure do not limit this.

The layout design of the shift register unit 200 shown in FIG. 2A and FIG. 2B in the display substrate 10 will be described below with reference to FIG. 8-FIG. 11B.

As shown in FIG. 2A, FIG. 2B, and FIG. 8-FIG. 10, each of the plurality of shift register units 200 included in the display substrate 10 includes an input circuit 210, an output circuit 220, a first reset circuit 230, and a frame reset signal connection line CL1. For example, the frame reset signal connection line CL1 may be connected to the above-mentioned frame reset signal line STVL to receive the frame reset signal. Regarding the input circuit 210, the output circuit 220, and the first reset circuit 230, reference may be made to the above description of the shift register unit 200, and details are not repeated here.

The frame reset signal connection line CL1 extends along the second direction R2, and is configured to provide the frame reset signal to the first reset circuit 230. The second direction R2 and the first direction R1 cross each other. For example, in some examples, the second direction R2 is perpendicular to the first direction R1. For example, the second direction R2 may be the extending direction of the gate line GL.

As shown in FIG. 2B and FIG. 8-FIG. 10, the first reset circuit 230 includes a first transistor M1 and a second transistor M2, as shown in FIG. 9A, the frame reset signal connection line CL1, the gate electrode G1 of the first transistor M1, and the gate electrode G2 of the second transistor M2 are disposed in the first conductive layer 601.

As shown in FIG. 9B, the shift register unit 200 further includes a first transfer electrode TE1 disposed in the second conductive layer 604. As shown in FIG. 9A-FIG. 9B, the gate electrode G1 of the first transistor M1 and the gate electrode G2 of the second transistor M2 are connected, and both are electrically connected to the frame reset signal connection line CL1 through the first transfer electrode TE1. For example, the gate electrode G1 of the first transistor M1 and the gate electrode G2 of the second transistor M2 are both connected to a connection portion 301.

As shown in FIG. 9A, FIG. 9B, and FIG. 9D, the frame reset signal connection line CL1 located in the first conductive layer 601 includes a connection portion 302, and the first transfer electrode TE1 located in the second conductive layer 604 includes a connection portion 303 and a connection portion 304. An orthographic projection of the connection portion 301 on the base substrate 100 and an orthographic projection of the connection portion 303 on the base substrate 100 at least partially overlap, and an orthographic projection of the connection portion 302 on the base substrate 100 and an orthographic projection of the connection portion 304 on the base substrate 100 at least partially overlap. The connection portion 301 located in the first conductive layer 601 may be electrically connected to the connection portion 303 located in the second conductive layer 604 through the via hole VH1 and the via hole VH2, and the connection portion 302 located in the first conductive layer 601 may be electrically connected to the connection portion 304 located in the second conductive layer 604 through the via hole VH3 and the via hole VH4.

For example, FIG. 11A shows a schematic diagram of the electrical connection between the connection portion 301 located in the first conductive layer 601 and the connection portion 303 located in the second conductive layer 604. For example, when the connection portion 303 is formed, the connection portion 303 can be directly contacted with the connection portion 301 through the holes VH1 and VH2, so as to implement electrical connection.

It should be noted that the connection portion 303 in the example shown in FIG. 11A is connected to the connection portion 301 through two via holes, and the embodiments of the present disclosure are not limited to this. For example, in some other examples, as shown in FIG. 11B, the connection portion 303 may also be connected to the connection portion 301 through only one via hole VH1.

In the embodiments of the present disclosure, when describing the electrical connection between a component located in the first conductive layer 601 and a component located in the second conductive layer 604, it is described by taking a case that the electrical connection is implemented through two via holes as an example, the embodiments of the present disclosure include, but are not limited to this, the two components may also be electrically connected through one via hole, three via holes, or more via holes.

In the display substrate 10 provided by the embodiment of the present disclosure, the frame reset signal connection line CL1 located in the first conductive layer 601 is electrically connected to the gate electrode G1 of the first transistor M1 and the gate electrode G2 of the second transistor M2 located in the first conductive layer 601 after passing through the first transfer electrode TE1 located in the second conductive layer 604, so that the frame reset signal connection line CL1 can avoid other components during layout, making the layout simpler and more reasonable, in addition, the number of layers required for line-bridging can be reduced, and the number of masks required in the manufacturing process can be reduced, thereby reducing the manufacturing cost of the display substrate 10.

As shown in FIG. 8, the first transistor M1 and the second transistor M2 are arranged adjacent to each other along the second direction R2. In the embodiment of the present disclosure, the adjacent arrangement of the first transistor M1 and the second transistor M2 along the second direction R2 can make the layout more compact and save the layout space, so that the area occupied by the peripheral region in the display substrate 10 can be reduced, the size of the frame of the display device including the display substrate 10 can be reduced, which is beneficial to implement the display device with a narrow frame.

As shown in FIG. 8, in some examples of the present disclosure, the size of the first transistor M1 and the size of the second transistor M2 are the same. For example, the length of the first transistor M1 is equal to the length of the second transistor M2, and the width of the first transistor M1 is equal to the width of the second transistor M2. For example, the width to length ratio of the first transistor M1 is consistent with the width to length ratio of the second transistor M2.

In the embodiment of the present disclosure, making the size (length and width) of the first transistor M1 having a substantially rectangular outline and the size of the second transistor M2 having a substantially rectangular outline the same can make the characteristics of the two transistors the same, for example, the turn-on currents are equal, so that the noise reduction characteristic of the first transistor M1 to the first node N1 can be the same as the noise reduction characteristic of the second transistor M2 to the output terminal OP.

As shown in FIG. 9B, the shift register unit 200 further includes a first voltage connection line CL2 extending along the second direction R2, and the first voltage connection line CL2 is configured to provide the shift register unit 200 with a first voltage, the first voltage is used to reset the first node N1 and the output terminal OP during a period of time BL between two display frames of the display substrate 10. For example, in an embodiment of the present disclosure, the first voltage is a low-level voltage.

As shown in FIG. 9B, the first voltage connection line CL2, the first electrode D1 and the second electrode S1 of the first transistor M1, and the first electrode D2 and the second electrode S2 of the second transistor M2 are all disposed in the second conductive layer 604.

The first electrode D1 of the first transistor M1 is electrically connected to the first node N1, the first electrode D2 of the second transistor M2 is electrically connected to the output terminal OP, the second electrode Si of the first transistor M1 and the second electrode S2 of the second transistor M2 are both electrically connected to the first voltage connection line CL2.

For example, in some examples, as shown in FIG. 9B, the shift register unit 200 further includes a branch line BL disposed in the second conductive layer 604 and extending along the first direction R1, the branch line BL is connected to the first voltage connection line CL2. The second electrode S1 of the first transistor M1 and the second electrode S2 of the second transistor M2 are respectively arranged on both sides of the branch line BL, and both are connected to the branch line BL. That is to say, the second electrode Si of the first transistor M1 and the second electrode S2 of the second transistor M2 are electrically connected to the first voltage connection line CL2 through the branch line BL.

For example, in some other examples, the second electrode Si of the first transistor M1 and the second electrode S2 of the second transistor M2 may also be symmetrically arranged on both sides of the branch line BL.

As shown in FIG. 9C, the first transistor M1 further includes an active layer AC1 located in the semiconductor layer 603, and the second transistor M2 further includes an active layer AC2 located in the semiconductor layer 603.

As shown in FIG. 9A, the shift register unit 200 further includes an input signal connection line CL3 extending along the second direction R2, and the input signal connection line CL3 is configured to provide an input signal to the input circuit 210. For example, when the plurality of shift register units 200 are cascaded, the input signal connection line CL3 of a a certain stage shift register unit may be connected to the output terminal OP of another stage shift register unit.

The input circuit 210 includes a third transistor M3. As shown in FIG. 9A, the input signal connection line CL3 and the gate electrode G3 of the third transistor M3 are both disposed in the first conductive layer 601, and the gate electrode G3 of the third transistor M3 is connected to the input signal connection line CL3. In the embodiment of the present disclosure, by setting the input signal connection line CL3 connected to the input circuit 210 (the third transistor M3), it is convenient for the plurality of shift register units to be cascaded.

As shown in FIG. 9A-FIG. 9B, the first electrode D3 and the second electrode S3 of the third transistor M3 are both disposed in the second conductive layer 604, the first electrode D3 of the third transistor M3 is electrically connected to the gate electrode G3 of the third transistor M3, the second electrode S3 of the third transistor M3 is connected to the first electrode D1 of the first transistor M1, and the first node N1 is a junction node of the second electrode S3 of the third transistor M3 and the first electrode D1 of the first transistor M1.

As shown in FIG. 9C, the third transistor M3 further includes an active layer AC3 located in the semiconductor layer 603.

As shown in FIG. 9A-FIG. 9B, the shift register unit 200 further includes a second transfer electrode TE2 disposed in the first conductive layer 601 and a third transfer electrode TE3 disposed in the second conductive layer 604, and an orthographic projection of the second transfer electrode TE2 on the base substrate 100 and an orthographic projection of the third transfer electrode TE3 on the base substrate 100 at least partially overlap.

The second transfer electrode TE2 is connected to the gate electrode G3 of the third transistor M3, the third transfer electrode TE3 is connected to the first electrode D3 of the third transistor M3, and the second transfer electrode TE2 is electrically connected to the third transfer electrode TE3.

For example, as shown in FIG. 9D, the second transfer electrode TE2 located in the first conductive layer 601 may be electrically connected to the third transfer electrode TE3 located in the second conductive layer 604 through the via hole VH5 and the via hole VH6. For example, the second transfer electrode TE2 is in direct contact with the third transfer electrode TE3 through the via hole VH5 and the via hole VH6 to implement electrical connection.

For example, as shown in FIG. 9B, the first electrode D3 of the third transistor M3 includes a first connection portion 701 extending along the first direction R1 and a plurality of first protrusion portions 702 extending along the second direction R2. The first connection portion 701 is connected to the third transfer electrode TE3, the plurality of first protrusion portions 702 are respectively connected to the first connection portion 701, and a plurality of first concave portions are formed between the plurality of first protrusion portions 702. That is, the shape of the orthographic projection of the first electrode D3 of the third transistor M3 on the base substrate 100 includes a plurality of U shapes.

The second electrode S3 of the third transistor M3 includes a second connection portion 703 extending along the first direction R1 and a plurality of second protrusion portions 704 extending along the second direction R2, the plurality of second protrusion portions 704 are respectively connected to the second connection portion 703, and a plurality of second concave portions are formed between the plurality of second protrusion portions 704. That is, the shape of the orthographic projection of the second electrode S3 of the third transistor M3 on the base substrate 100 includes a plurality of U shapes.

The plurality of first protrusion portions 702 protrude into the plurality of second concave portions between the plurality of second protrusion portions 704, so that the plurality of second protrusion portions 704 and the plurality of first protrusion portions 702 are sequentially spaced along the first direction R1.

In the embodiment of the present disclosure, the turn-on current of the third transistor M3 can be improved by adopting this layout structure for the first electrode and the second electrode of the third transistor M3. Similarly, in the subsequent description, the first electrode and the second electrode of the other transistor adopt a layout structure similar to that of the third transistor M3, which can also improve the turn-on current of the transistor.

As shown in FIG. 9B, the shift register unit 200 further includes a clock signal connection line CL4 extending along the second direction R2, and the clock signal connection line CL4 is configured to provide a clock signal to the output circuit 220. For example, the clock signal connection line CL4 is electrically connected to the clock signal line (for example, one selected from a group consisting of the first clock signal line CLK1, the second clock signal line CLK2, the third clock signal line CLK3, the fourth clock signal line CLK4, the fifth clock signal line CLK5, and the sixth clock signal line CLK6) to receive the clock signal.

The output circuit 220 includes a fourth transistor M4 and a first capacitor C1. As shown in FIG. 9A, a gate electrode G4 of the fourth transistor M4 and a first electrode 801 of the first capacitor C1 are disposed in the first conductive layer 601, and the first electrode 801 of the first capacitor C1 is located on the side of the gate electrode G4 of the fourth transistor M4 close to the display region 110 of the display substrate 10.

As shown in FIG. 9B, the first electrode D4 and the second electrode S4 of the fourth transistor M4, the second electrode 802 of the first capacitor C1, and the clock signal connection line CL4 are all disposed in the second conductive layer 604.

As shown in FIG. 9C, the fourth transistor M4 further includes an active layer AC4 located in the semiconductor layer 603.

For example, as shown in FIG. 8 and FIG. 9A-FIG.9C, the fourth transistor M4 includes a plurality of sub-transistors ST connected in parallel along the second direction R2, each sub-transistor ST includes a gate electrode disposed in the first conductive layer 601, a first electrode and a second electrode disposed in the second conductive layer 604, and an active layer disposed in the semiconductor layer 603. The gate electrodes of the plurality of sub-transistors ST are connected to each other, the first electrodes of the plurality of sub-transistors ST are connected to each other, the second electrodes of the plurality of sub-transistors ST are connected to each other, and the active layers of the plurality of sub-transistors ST are sequentially arranged along the second direction R2 and are independent of each other and are not connected to each other.

In the embodiment of the present disclosure, the fourth transistor M4 adopts a form in which a plurality of sub-transistors ST are connected in parallel, so that the driving capability of the output signal of the fourth transistor M4 can be improved.

For example, as shown in FIG. 9A-FIG. 9B, the orthographic projection of the clock signal connection line CL4 on the base substrate 100 and the orthographic projection of the input signal connection line CL3 on the base substrate 100 are partially parallel and partially overlap. In the embodiment of the present disclosure, the input signal connection line CL3 and the clock signal connection line CL4 are respectively disposed in the first conductive layer 601 and the second conductive layer 604, so that the two lines can avoid each other, so that the layout of the display substrate 10 is simpler and more reasonable.

As shown in FIG. 9A-FIG. 9B, the gate electrode G4 of the fourth transistor M4 is electrically connected to the second electrode S3 of the third transistor M3, the first electrode D4 of the fourth transistor M4 is connected to the clock signal connection line CL4 to receive the clock signal, and the second electrode S4 of the fourth transistor M4 is connected to the first electrode D2 of the second transistor M2. The first electrode 801 of the first capacitor C1 is connected to the gate electrode G4 of the fourth transistor M4, and the second electrode 802 of the first capacitor C1 is connected to the second electrode 802 of the fourth transistor M4.

As shown in FIG. 9A-FIG. 9B, the shift register unit 200 further includes a fourth transfer electrode TE4 disposed in the first conductive layer 601 and a fifth transfer electrode TE5 disposed in the second conductive layer 604, an orthographic projection of the fourth transfer electrode TE4 on the base substrate and an orthographic projection of the fifth transfer electrode TE5 on the base substrate at least partially overlap, and the fourth transfer electrode TE4 and the fifth transfer electrode TE5 are electrically connected.

As shown in FIG. 9D, the fourth transfer electrode TE4 located in the first conductive layer 601 may be electrically connected to the fifth transfer electrode TE5 located in the second conductive layer 604 through the via hole VH7 and the via hole VH8. For example, the fourth transfer electrode TE4 is in direct contact with the fifth transfer electrode TE5 through the via hole VH7 and the via hole VH8 to achieve electrical connection.

The fourth transfer electrode TE4 is between the gate electrode G3 of the third transistor M3 and the gate electrode G1 of the first transistor M1, and the fifth transfer electrode TE5 is between the second electrode S3 of the third transistor M3 and the first electrode D1 of the first transistor M1. The fourth transfer electrode TE4 is electrically connected to the gate electrode G4 of the fourth transistor M4, and the fifth transfer electrode TE5 is connected to the first electrode D1 of the first transistor M1 and the second electrode S3 of the third transistor M3.

For example, as shown in FIG. 9A, the shift register unit 200 further includes a first connection electrode CE1 disposed in the first conductive layer 601, and both ends of the first connection electrode CE1 are respectively connected to the gate electrode G4 of the fourth transistor M4 and the fourth transfer electrode TE4. The first connection electrode CE1 is located on the side of the input signal connection line CL3 close to the first transistor M1, and the orthographic portion of the first connection electrode CE1 and the orthographic portion of the input signal connection line CL3 on the base substrate 100 are partially parallel.

That is to say, the gate electrode G4 of the fourth transistor M4 is electrically connected to the second electrode S3 of the third transistor M3 through the first connection electrode CE1, the fourth transfer electrode TE4, the via hole VH7 and the via hole VH8, and the fifth transfer electrode TE5. Taking this mode in which the connection electrode and the transfer electrode are used to achieve electrical connection, not only can the layout of the transistors in the shift register unit 10 be made more compact, but also the number of layers required for line-bridge can be reduced, and the number of masks required in the manufacturing process can be reduced, thereby reducing the manufacturing cost of the display substrate 10.

In some embodiments, the shift register unit 200 further includes a control circuit 240, and the control circuit 240 is configured to control the level of the second node N2 according to the level of the first node N1. For the control circuit 240, reference may be made to the above description of the shift register unit 200, and details are not repeated here.

As shown in FIG. 8 and FIG. 9A-FIG. 9B, the control circuit 240 includes a fifth transistor M5, a sixth transistor M6, a seventh transistor M7, and an eighth transistor M8. For example, the eighth transistor M8, the seventh transistor M7, and the sixth transistor M6 are arranged adjacently in sequence along the second direction R2, the fifth transistor M5 and the eighth transistor M8 are arranged adjacently along the first direction R1, and the sixth transistor M6 and the third transistor M3 are arranged adjacently along the first direction RE In the embodiment of the present disclosure, this arrangement mode can make the layout more compact and save the layout space, so that the area occupied by the peripheral region in the display substrate 10 can be reduced, and therefore, the size of the frame of the display device including the display substrate 10 can be reduced, thereby facilitating the implementation of the display device with a narrow frame.

The gate electrode G5 of the fifth transistor M5, the gate electrode G6 of the sixth transistor M6, the gate electrode G7 of the seventh transistor M7, and the gate electrode G8 of the eighth transistor M8 are all disposed in the first conductive layer 601, and the first electrode D5 and the second electrode S5 of the fifth transistor M5, the first electrode D6 and the second electrode S6 of the sixth transistor M6, the first electrode D7 and the second electrode S7 of the seventh transistor M7, and the first electrode D8 and the second electrode S8 of the eighth transistor M8 are all disposed in the second conductive layer 604.

As shown in FIG. 9C, the fifth transistor M5 further includes an active layer AC5 located in the semiconductor layer 603; the sixth transistor M6 further includes an active layer AC6 located in the semiconductor layer 603; the seventh transistor M7 further includes an active layer AC7 located in the semiconductor layer 603; and the eighth transistor M8 further includes an active layer AC8 located in the semiconductor layer 603.

As shown in FIG. 9A-FIG. 9B, the gate electrode G8 of the eighth transistor M8 is electrically connected to the first electrode D8 of the eighth transistor M8 and is configured to receive a second voltage different from the first voltage. For example, in the embodiment of the present disclosure, the second voltage is a high-level voltage.

The second electrode S8 of the eighth transistor M8 is connected to the first electrode D7 of the seventh transistor M7, the gate electrode G7 of the seventh transistor M7 is connected to the gate electrode G6 of the sixth transistor M6, and the second electrode S7 of the seventh transistor M7 is connected to the first voltage connection line CL2 to receive the low-level first voltage.

The gate electrode G5 of the fifth transistor M5 is electrically connected to the second electrode S8 of the eighth transistor M8, the first electrode D5 of the fifth transistor M5 is electrically connected to the first electrode D6 of the sixth transistor M6, the second electrode S5 of the fifth transistor M5 is electrically connected to the first electrode D8 of the eighth transistor M8, the gate electrode G6 of the sixth transistor M6 is connected to the fourth transfer electrode TE4, and the second electrode S6 of the sixth transistor M6 is connected to the first voltage connection line CL2. The second node N2 is a junction node of the first electrode D5 of the fifth transistor M5 and the first electrode D6 of the sixth transistor M6.

As shown in FIG. 9A-FIG. 9B, the shift register unit 200 further includes a sixth transfer electrode TE6 disposed in the first conductive layer 601 and a seventh transfer electrode TE7 disposed in the second conductive layer 604, an orthographic projection of the sixth transfer electrode TE6 and an orthographic projection of the seventh transfer electrode TE7 on the base substrate 100 at least partially overlap, and the sixth transfer electrode TE6 and the seventh transfer electrode TE7 are electrically connected.

As shown in FIG. 9D, the sixth transfer electrode TE6 located in the first conductive layer 601 may be electrically connected to the seventh transfer electrode TE7 located in the second conductive layer 604 through the via hole VH9 and the via hole VH10. For example, the sixth transfer electrode TE6 is in direct contact with the seventh transfer electrode TE7 through the via hole VH9 and the via hole VH10 to achieve electrical connection.

As shown in FIGS. 9A-9B, the sixth transfer electrode TE6 is between the gate electrode G5 of the fifth transistor M5 and the gate electrode G8 of the eighth transistor M8, and is connected to the gate electrode G8 of the eighth transistor M8. The seventh transfer electrode TE7 is between the second electrode S5 of the fifth transistor M5 and the first electrode D8 of the eighth transistor M8, and is connected to the second electrode S5 of the fifth transistor M5 and the first electrode D8 of the eighth transistor M8.

As described above, the gate electrode G8 of the eighth transistor M8 is electrically connected to the first electrode D8 of the eighth transistor M8 through the sixth transfer electrode TE6, the via hole VH9, the via hole VH10, and the seventh transfer electrode TE7. Using the transfer electrode to achieve the electrical connection can not only make the layout of the transistors in the shift register unit 10 more compact, but also reduce the number of layers required for line-bridge, and the number of masks required in the manufacturing process can be reduced, thereby reducing the manufacturing cost of the display substrate 10.

As shown in FIG. 9A-FIG. 9B, the shift register unit 200 further includes an eighth transfer electrode TE8 disposed in the first conductive layer 601 and a ninth transfer electrode TE9 disposed in the second conductive layer 604, an orthographic projection of the eighth transfer electrode TE8 and an orthographic projection of the ninth transfer electrode TE9 on the base substrate 100 at least partially overlap, and the eighth transfer electrode TE8 and the ninth transfer electrode TE9 are electrically connected.

As shown in FIG. 9D, the eighth transfer electrode TE8 located in the first conductive layer 601 may be electrically connected to the ninth transfer electrode TE9 located in the second conductive layer 604 through the via hole VH11 and the via hole VH12. For example, the eighth transfer electrode TE8 is in direct contact with the ninth transfer electrode TE9 through the holes VH11 and VH12 to achieve electrical connection.

As shown in FIG. 9A-FIG. 9B, the eighth transfer electrode TE8 is on the side of the sixth transfer electrode TE6 close to the display region 110, and the eighth transfer electrodes TE8 and the sixth transfer electrodes TE6 are arranged adjacent to each other along the second direction R2. The ninth transfer electrode TE9 is on the side of the seventh transfer electrode TE7 close to the display region 110, and the ninth transfer electrode TE9 and the seventh transfer electrode TE7 are arranged adjacent to each other along the second direction R2.

The eighth transfer electrode TE8 is connected to the gate electrode G5 of the fifth transistor M5, and the ninth transfer electrode TE9 is connected to the second electrode S8 of the eighth transistor M8 and the first electrode D7 of the seventh transistor M7. That is, the gate electrode G5 of the fifth transistor M5 is electrically connected to the second electrode S8 of the eighth transistor M8 through the eighth transfer electrode TE8, the via hole VH11, the via hole VH12, and the ninth transfer electrode TE9. Using the transfer electrode to achieve the electrical connection can not only make the layout of the transistors in the shift register unit 10 more compact, but also reduce the number of layers required for line-bridge, and the number of masks required in the manufacturing process can be reduced, thereby reducing the manufacturing cost of the display substrate 10.

In some embodiments, the shift register unit 200 further includes a second reset circuit 250, and the second reset circuit 250 is configured to control the level of the second node N2 in response to the input signal. For the second reset circuit 250, reference may be made to the above description of the shift register unit 200, and details are not repeated here.

The second reset circuit 250 includes a ninth transistor M9. As shown in FIG. 8, the fifth transistor M5, the ninth transistor M9, and the third transistor M3 are sequentially arranged along the second direction R2, and the ninth transistor M9 and the seventh transistor M7 are arranged adjacently along the first direction R1. In the embodiments of the present disclosure, by adopting this arrangement, the layout can be made more compact, the layout space can be saved, and the area occupied by the peripheral region of the display substrate 10 can be reduced, and therefore, the size of the frame of the display device including the display substrate 10 can be reduced, thereby facilitating the implementation of the display device with a narrow frame.

As shown in FIG. 9A-FIG. 9B, the gate electrode G9 of the ninth transistor M9 is disposed in the first conductive layer 601, and the first electrode D9 and the second electrode S9 of the ninth transistor M9 are disposed in the second conductive layer 604. As shown in FIG. 9C, the ninth transistor M9 further includes an active layer AC9 located in the semiconductor layer 603.

As shown in FIG. 9A-FIG. 9B, the gate electrode G9 of the ninth transistor M9 is connected to the second transfer electrode TE2, the first electrode D9 of the ninth transistor M9 is connected to the first electrode D5 of the fifth transistor M5, and the second electrode S9 of the ninth transistor M9 is connected to the second electrode S7 of the seventh transistor M7. The second transfer electrode TE2 is located between the gate electrode G9 of the ninth transistor M9 and the gate electrode G3 of the third transistor M3.

As shown in FIG. 9B, the shift register unit 200 further includes a second connection electrode CE2 disposed in the second conductive layer 604. Both ends of the second connection electrode CE2 are respectively connected to the first electrode D9 of the ninth transistor M9 and the first electrode D6 of the sixth transistor M6. That is to say, the first electrode D5 of the fifth transistor M5 is electrically connected to the first electrode D6 of the sixth transistor M6 through the first electrode D9 of the ninth transistor M9 and the second connection electrode CE2.

In some embodiments, the shift register unit 200 further includes a third reset circuit 260, and the third reset circuit 260 is configured to reset the first node N1 and the output terminal OP under control of the level of the second node N2. For the third reset circuit 260, reference may be made to the above description of the shift register unit 200, and details are not repeated here.

The third reset circuit 260 includes a tenth transistor M10 and an eleventh transistor M11. As shown in FIG. 8, the tenth transistor M10 and the eleventh transistor M11 are arranged adjacently along the second direction R2, the tenth transistor M10 and the first transistor M1 are arranged adjacently along the first direction R1, and the eleventh transistor M11 and the second transistor M2 are arranged adjacently along the first direction R1. In the embodiments of the present disclosure, by adopting this arrangement, the layout can be made more compact, the layout space can be saved, and the area occupied by the peripheral region of the display substrate 10 can be reduced, and therefore, the size of the frame of the display device including the display substrate 10 can be reduced, thereby facilitating the implementation of the display device with a narrow frame.

As shown in FIG. 8, in some examples of the present disclosure, the length of the eleventh transistor M11 is equal to the length of the second transistor M2; for example, the length of the eleventh transistor M11 is also equal to the length of the first transistor M1; for example, the width of the eleventh transistor M11 is greater than the width of the second transistor M2.

For example, the length of the tenth transistor M10 is smaller than the length of the eleventh transistor M11. For another example, the width of the tenth transistor M10 is equal to the width of the eleventh transistor M11.

In the embodiment of the present disclosure, by designing the size (length and width) of the eleventh transistor M11 having a substantially rectangular outline and the size of the tenth transistor M10 having a substantially rectangular outline, the layout can be made more compact and the layout space can be saved, so that the area occupied by the peripheral region of the display substrate 10 can be reduced, and therefore, the size of the frame of the display device including the display substrate 10 can be reduced, thereby facilitating the implementation of the display device with a narrow frame.

As shown in FIG. 9A-FIG. 9B, the gate electrode G10 of the tenth transistor M10 and the gate electrode G11 of the eleventh transistor M11 are disposed in the first conductive layer 601, the first electrode D10 and the second electrode S10 of the tenth transistor M10 and the first electrode D11 and the second electrode S11 of the eleventh transistor M11 are disposed in the second conductive layer 604.

As shown in FIG. 9C, the tenth transistor M10 further includes an active layer AC10 located in the semiconductor layer 603, and the eleventh transistor M11 further includes an active layer AC11 located in the semiconductor layer 603.

As shown in FIG. 9A-FIG. 9B, the gate electrode G10 of the tenth transistor M10 is connected to the gate electrode G11 of the eleventh transistor M11, and the gate electrode G10 of the tenth transistor M10 and the gate electrode G11 of the eleventh transistor M11 are both electrically connected to the second node N2, the first electrode D10 of the tenth transistor M10 is connected to the first electrode D1 of the first transistor M1, the first electrode D11 of the eleventh transistor M11 is connected to the first electrode D2 of the second transistor M2, the second electrode S10 of the tenth transistor M10 and the second electrode S11 of the eleventh transistor M11 are both electrically connected to the first voltage connection line CL2.

For example, the second electrode S10 of the tenth transistor M10 and the second electrode S11 of the eleventh transistor M11 are both connected to the branch line BL, so as to achieve electrical connection with the first voltage connection line CL2.

As shown in FIG. 9A-FIG. 9B, the shift register unit 200 further includes a tenth transfer electrode TE10 disposed in the first conductive layer 601 and an eleventh transfer electrode TEll disposed in the second conductive layer 604. An orthographic projection of the tenth transfer electrode TE10 and an orthographic projection of the eleventh transfer electrode TE11 on the base substrate 100 at least partially overlap, and the tenth transfer electrode TE10 and the eleventh transfer electrode TE11 are electrically connected.

As shown in FIG. 9D, the tenth transfer electrode TE10 located in the first conductive layer 601 may be electrically connected to the eleventh transfer electrode TE11 located in the second conductive layer 604 through the via hole VH13 and the via hole VH14. For example, the tenth transfer electrode TE10 is in direct contact with the eleventh transfer electrode TE11 through the via hole VH13 and the via hole VH14 to achieve electrical connection.

As shown in FIG. 9A-FIG. 9B, the tenth transfer electrode TE10 is between the gate electrode G6 of the sixth transistor M6 and the gate electrode G10 of the tenth transistor M10, and the tenth transfer electrode TE10 is connected to the gate electrode G10 of the tenth transistor M10. The eleventh transfer electrode T11 is connected to the first electrode D6 of the sixth transistor M6. That is to say, the gate electrode G10 of the tenth transistor M10 and the gate electrode G11 of the eleventh transistor M11 are electrically connected to the first electrode D6 of the sixth transistor M6, namely electrically connected to the second node N2, through the tenth transfer electrode TE10, the via hole VH13, the via hole VH14, and the eleventh transfer electrode TE11. Using the mode of achieving electrical connection through the transfer electrodes can not only make the layout of the transistors in the shift register unit 10 more compact, but also reduce the number of layers required for line-bridge and reduce the number of masks required in the manufacturing process, thereby reducing the manufacturing cost of the display substrate 10.

In some embodiments, the shift register unit 200 further includes a fourth reset circuit 270, and the fourth reset circuit 270 is configured to reset the first node N1 in response to the scan reset signal. For the fourth reset circuit 270, reference may be made to the above description of the shift register unit 200, and details are not repeated here.

The fourth reset circuit 270 includes a twelfth transistor M12. As shown in FIG. 8, the twelfth transistor M12 is located on a side of the first capacitor C1 close to the display region 110. That is, the twelfth transistor M12 is located between the first capacitor C1 and the display region 110. In this way, it is more convenient for the twelfth transistor M12 to be connected to the output terminal of other shift register unit to receive the scan reset signal, that is, it is convenient for cascading the plurality of shift register units.

As shown in FIG. 9A-FIG. 9B, the gate electrode G12 of the twelfth transistor M12 is disposed in the first conductive layer 601, and the first electrode D12 and the second electrode S12 of the twelfth transistor M12 are disposed in the second conductive layer 604. As shown in FIG. 9C, the twelfth transistor M12 further includes an active layer AC12 located in the semiconductor layer 603.

As shown in FIG. 9A-FIG. 9B, the gate electrode G12 of the twelfth transistor M12 is configured to receive the scan reset signal. For example, when the plurality of shift register units 200 are cascaded, the gate electrode G12 of the twelfth transistor M12 in a certain stage shift register unit 200 may be connected to the output terminal OP of the other stage shift register unit to receive the scan reset signal.

The first electrode D12 of the twelfth transistor M12 is electrically connected to the first node N1, and the second electrode S12 of the twelfth transistor M12 is connected to the first voltage connection line CL2 to receive the low-level first voltage.

As shown in FIG. 9B, the shift register unit 200 further includes a twelfth transfer electrode TE12 disposed in the second conductive layer 604, and the twelfth transfer electrode TE12 is connected to the first electrode D12 of the twelfth transistor M12. An orthographic projection of the twelfth transfer electrode TE12 and an orthographic projection of the first electrode 801 of the first capacitor C1 on the base substrate 100 at least partially overlap, and the twelfth transfer electrode TE12 is electrically connected to the first electrode 801 of the first capacitor C1.

For example, as shown in FIG. 9C, the twelfth transfer electrode TE12 may be electrically connected to the first electrode 801 of the first capacitor C1 through the via hole VH15 and the via hole VH16. For example, the twelfth transfer electrode TE12 is in direct contact with the first electrode 801 of the first capacitor C1 through the via hole VH15 and the via hole VH16 to achieve electrical connection.

That is to say, the first electrode D12 of the twelfth transistor M12 is electrically connected to the first node N1 through the twelfth transfer electrode TE12, the via hole VH15 and the via hole VH16, and the first electrode 801 of the first capacitor C1.

For example, as shown in FIG. 9A-FIG. 9B, the shift register unit 200 further includes a thirteenth transfer electrode TE13 disposed in the first conductive layer 601 and a fourteenth transfer electrode TE14 disposed in the second conductive layer 604, an orthographic projection of the thirteenth transfer electrode TE13 and an orthographic projection of the fourteenth transfer electrode TE14 on the base substrate 100 at least partially overlap, and the thirteenth transfer electrode TE13 and the fourteenth transfer electrode TE14 are electrically connected.

As shown in FIG. 9D, the thirteenth transfer electrode TE13 in the first conductive layer 601 may be electrically connected to the fourteenth transfer electrode TE14 in the second conductive layer 604 through the via hole VH17 and the via hole VH18. For example, the thirteenth transfer electrode TE13 is in direct contact with the fourteenth transfer electrode TE14 through the via hole VH17 and the via hole VH18 to achieve electrical connection.

As shown in FIG. 9A-FIG. 9B, the fourteenth transfer electrode TE14 is connected to the second electrode 802 (the output terminal OP) of the first capacitor C1. For example, when the plurality of shift register units 200 are cascaded, the thirteenth transfer electrode TE13 of a certain stage shift register unit 200 can be connected to the gate electrode G12 of the twelfth transistor M12 of other stage shift register unit to provide the scan reset signal, or may be connected to the input signal connection line CL3 of the other stage shift register unit to provide the input signal; that is, it is convenient for the plurality of shift register units to be cascaded.

In the display substrate 10 provided by the embodiments of the present disclosure, by reasonably arranging the transfer electrodes and the holes, a component located in the first conductive layer 601 (e.g., a gate electrode of a transistor) can be electrically connected to a component (e.g., a first electrode or a second electrode of the transistor) located in the second conductive layer 604, thereby achieving the corresponding circuit structure. In this way, the layout of the display substrate 10 can be made more reasonable and compact, and in addition, the number of layers required for line-bridge can be reduced, and the number of masks required in the manufacturing process can be reduced, thereby reducing the manufacturing cost of the display substrate 10.

As shown in FIG. 9A, the plane shapes of the gate electrodes G1~G12 of the respective transistors of the shift register unit 200 are block-shaped, for example, are substantially rectangular.

As shown in FIG. 9C, the plane shapes of the active layers AC1~AC12 of the respective transistors of the shift register unit 200 are block-shaped, for example, are substantially rectangular, and are arranged approximately uniformly, which is beneficial to correspond to the block-shaped gate electrodes G1~G12, respectively, and is beneficial to implement the patterning process for the semiconductor layer and maintain the etching uniformity in the etching process.

As shown in FIG. 9B, the plane shape of the overall outer contour of the source electrode and the drain electrode of each transistor of the shift register unit 200 (one of the source electrode and the drain electrode is a U-shaped electrode and the other of the source electrode and the drain electrode is an I-shaped electrode) is block-shaped, for example, is substantially rectangular. Corresponding to the block-shaped active layers AC1~AC12, the source electrodes and the drain electrodes of the transistors define one or more U-shaped channel regions, which increases the channel width and reduces the channel length at the same time, thereby increasing the width to length ratio of the channel region of each transistor, and helping to improve the switching performance of each transistor.

FIG. 1C is a layout diagram corresponding to the shift register unit shown in FIG. 1A. Comparing FIG. 1C and FIG. 8, it can be found that a large gap space is between the transistors in the shift register unit shown in FIG. 1C, the layout is not compact, and a lot of layout space is wasted. However, in the display substrate 10 provided by the abovementioned embodiments of the present disclosure, as shown in FIG. 8, by designing the arrangement of the respective transistors and lines in the shift register unit, the layout of the display substrate 10 can be made more compact, and the layout space can be saved, so that the area occupied by the peripheral region in the display substrate 10 can be reduced, so that the frame size of the display device including the display substrate 10 can be reduced, thus reducing the size of the frame of the display device including the display substrate 10 and facilitating the implementation of a display device with a narrow frame.

For example, as shown in FIG. 9B, the shape of the orthographic projection of one of the first electrode and the second electrode (e.g., the first electrode) of any transistor in the shift register unit 200 on the base substrate 100 includes at least one U shape, and the shape of the orthographic projection of the other (e.g., the second electrode) of the first electrode and the second electrode of the any transistor on the base substrate 100 includes at least one I shape.

For example, the shape of the orthographic projection of the first electrode D1 of the first transistor M1, the shape of the orthographic projection of the first electrode D2 of the second transistor M2, the shape of the orthographic projection of the first electrode D5 of the fifth transistor M5, the shape of the orthographic projection of the first electrode D7 of the seventh transistor M7, the shape of the orthographic projection of the first electrode D8 of the eighth transistor M8, the shape of the orthographic projection of the first electrode D9 of the ninth transistor M9, and the shape of the orthographic projection of the first electrode D12 of the twelfth transistor M12 on the base substrate 100 all are U shapes, the shape of the orthographic projection of the second electrode S1 of the first transistor M1, the shape of the orthographic projection of the second electrode S2 of the second transistor M2, the shape of the orthographic projection of the second electrode S5 of the fifth transistor M5, the shape of the orthographic projection of the second electrode S7 of the seventh transistor M7, the shape of the orthographic projection of the second electrode S8 of the eighth transistor M8, the shape of the orthographic projection of the second electrode S9 of the ninth transistor M9, and the shape of the orthographic projection of the second electrode S12 of the twelfth transistor M12 on the base substrate 100 all are I shapes, and the second electrode of the above transistor protrudes into the corresponding first electrode.

For another example, each selected from a group consisting of the orthographic projection of the first electrode D3 of the third transistor M3, the orthographic projection of the first electrode D4 of the fourth transistor M4, the orthographic projection of the first electrode D6 of the sixth transistor M6, the orthographic projection of the first electrode D10 of the tenth transistor M10, and the orthographic projection of the first electrode D11 of the eleventh transistor M11 on the base substrate 100 includes a plurality of U shapes, each selected from a group consisting of the orthographic projection of the second electrode S3 of the third transistor M3, the orthographic projection of the second electrode S4 of the fourth transistor M4, the orthographic projection of the second electrode S6 of the sixth transistor M6, the orthographic projection of the second electrode S10 of the tenth transistor M10, and the orthographic projection of the second electrode S11 of the eleventh transistor M11 on the base substrate 100 includes a plurality of U shapes, and the first electrode and the second electrode of the abovementioned transistor cross each other.

For example, as shown in FIG. 9A and FIG. 9C, the orthographic projection of the gate electrode of any transistor in the shift register unit 200 on the base substrate 100 covers the orthographic projection of the active layer of the any transistor on the base substrate. For example, in one example, the orthographic projection of the gate electrode of any transistor on the base substrate 100 may be coincide with the orthographic projection of the active layer of the any transistor on the base substrate.

In the embodiment of the present disclosure, for example, the material of the semiconductor layer 603 may include oxide semiconductor, organic semiconductor, or amorphous silicon, polysilicon, etc., for example, the oxide semiconductor includes metal oxide semiconductor (e.g., indium gallium zinc oxide (IGZO)), the polysilicon includes low temperature polysilicon or high temperature polysilicon, etc., and the embodiments of the present disclosure are not limited thereto.

Figure 12:
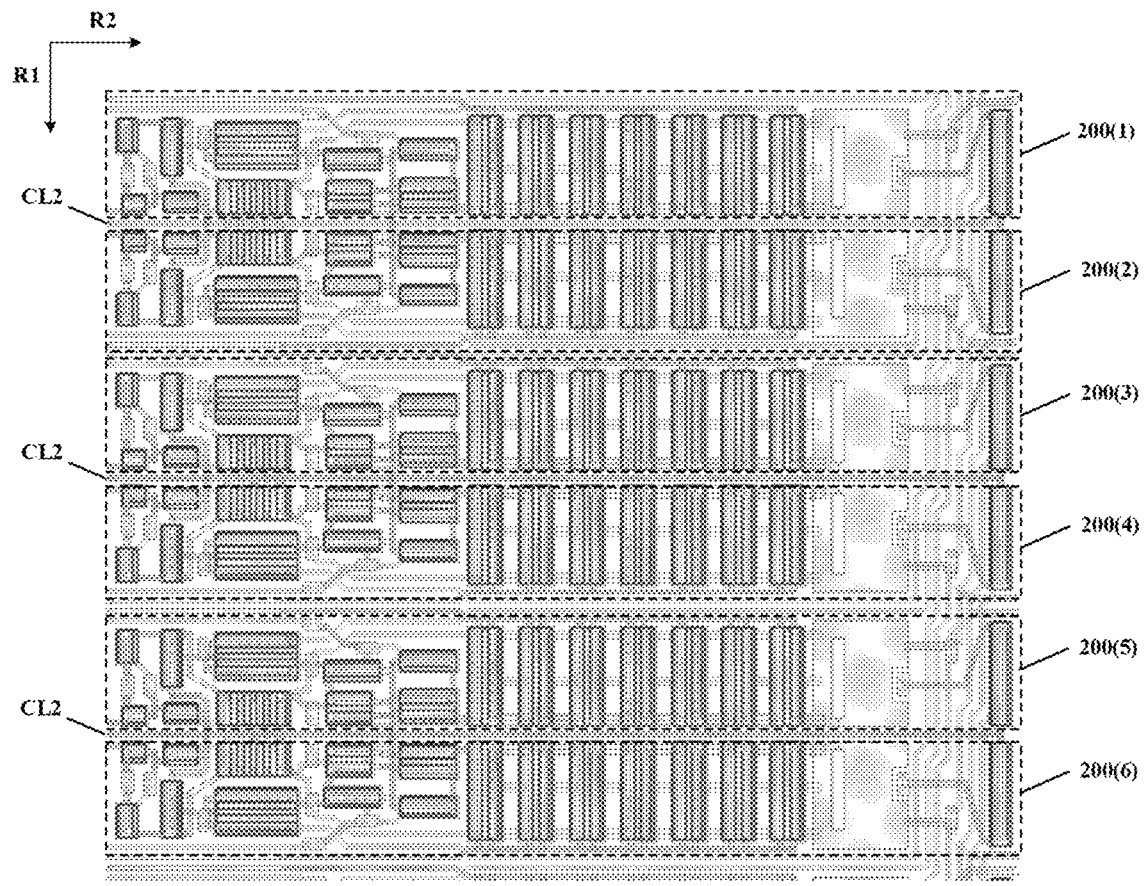
FIG. 12 is a layout diagram corresponding to the schematic diagram of cascade of a plurality of shift register units shown in FIG. 6.
Figure 13A:
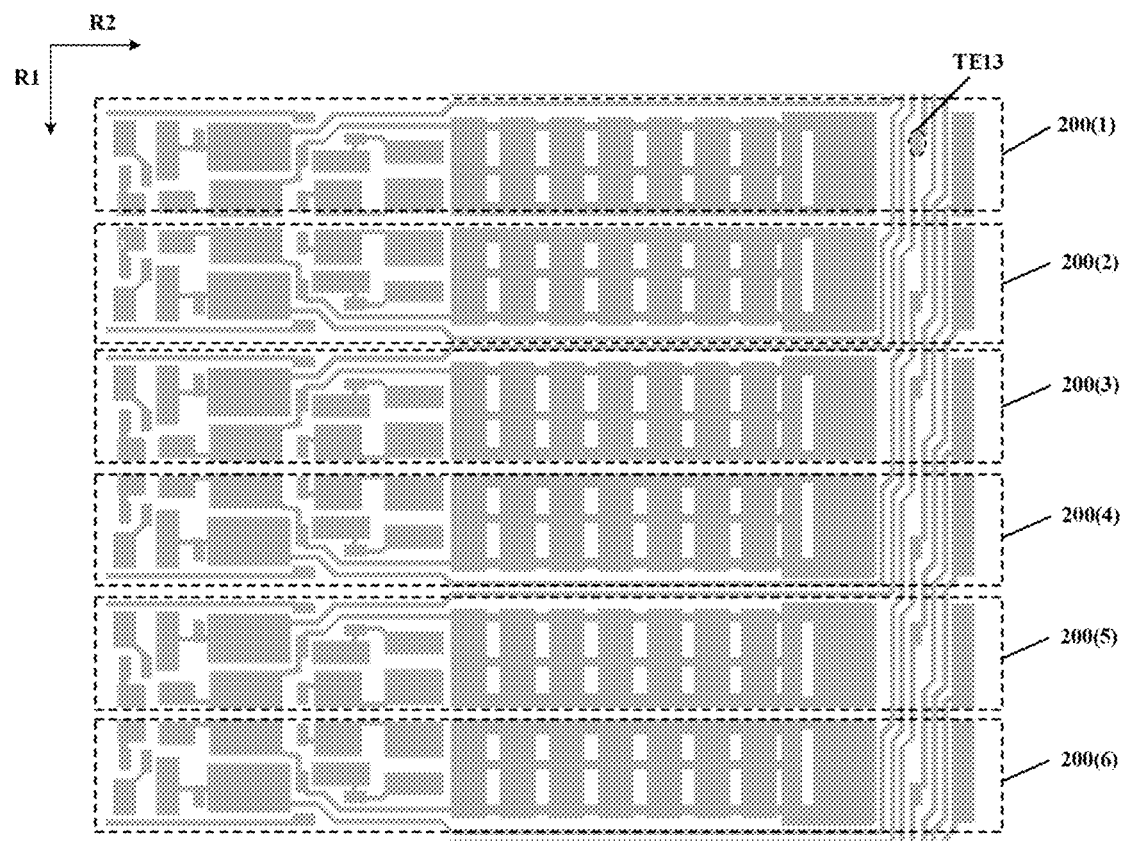
FIG. 13A, FIG. 13B, and FIG. 13C are layout diagrams corresponding to a first conductive layer, a second conductive layer, and a semiconductor layer in FIG. 12, respectively.
Figure 13B:
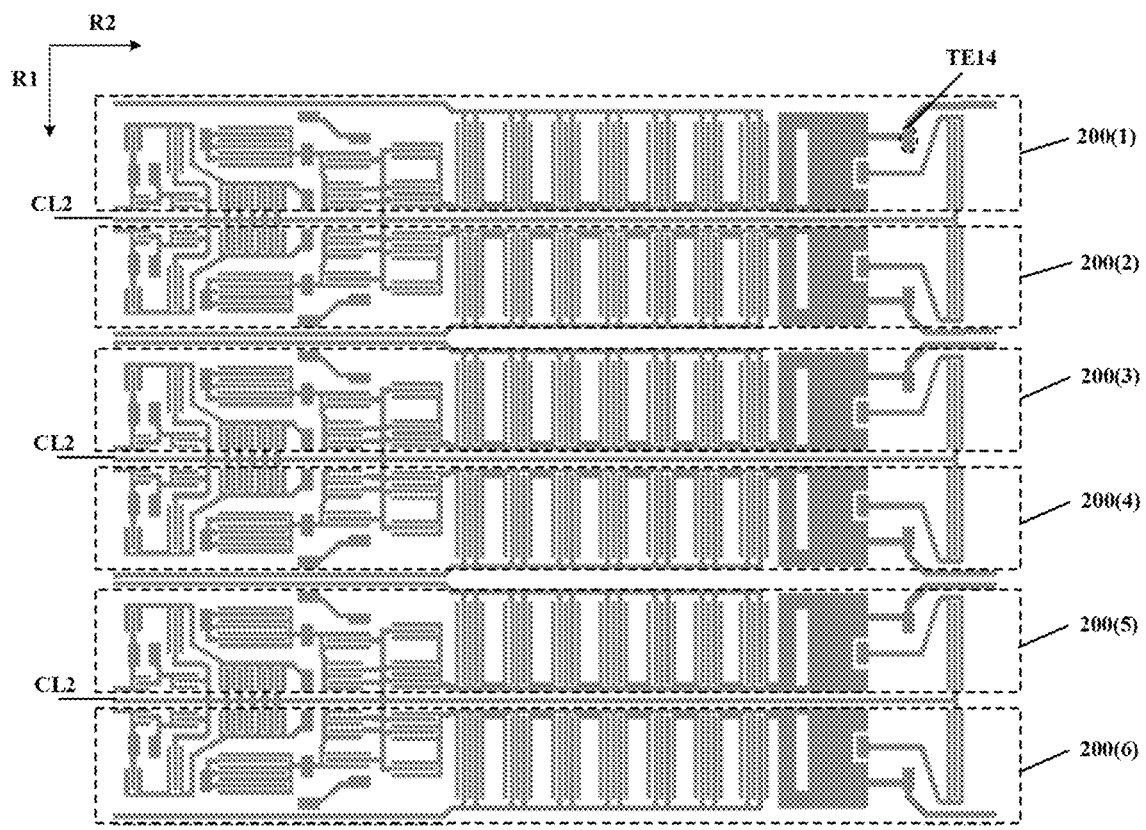
Figure 13C:
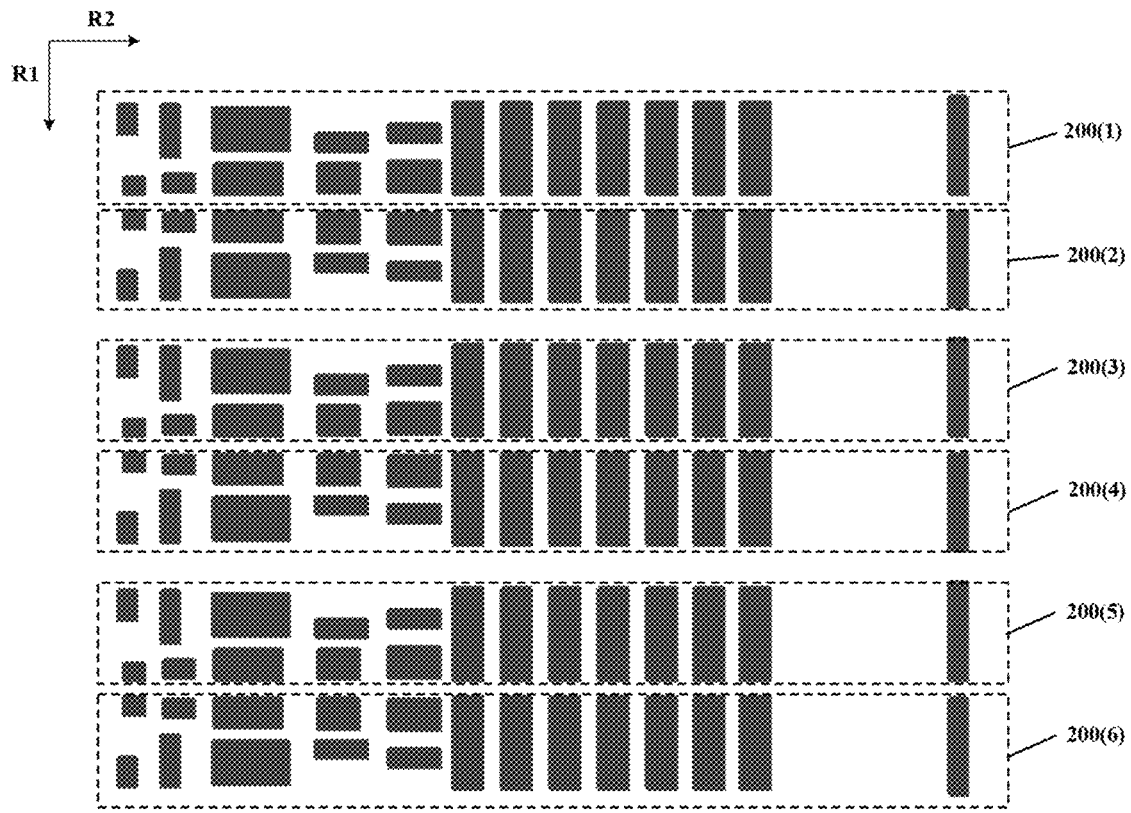

FIG. 12 is a layout diagram corresponding to the schematic diagram that a plurality of shift register units as shown in FIG. 6 are cascaded. FIG. 13A, FIG. 13B, and FIG. 13C are layout diagrams corresponding to a first conductive layer, a second conductive layer, and a semiconductor layer in FIG. 12, respectively.

For example, as shown in FIG. 12, the plurality of shift register units include a first shift register unit 200(1) and a second shift register unit 200(2) that are adjacently arranged in the first direction R1, and the first shift register unit 200(1) and the second shift register unit 200(2) share the same first voltage connection line CL2 and are axially symmetrically distributed with respect to the same first voltage connection line CL2. Similarly, the third shift register unit 200(3) and the fourth shift register unit 200(4) share the same first voltage connection line CL2 and are axially symmetrically distributed with respect to the same first voltage connection line CL2; the fifth shift register unit 200(5) and the sixth shift register unit 200(6) share the same first voltage connection line CL2 and are axially symmetrically distributed with respect to the same first voltage connection line CL2.

In the display substrate 10 provided by the embodiments of the present disclosure, two adjacent shift register units sharing the same first voltage connection line can save half the number of the first voltage connection lines, thereby also saving the layout space corresponding to the first voltage connection lines, so that the layout of the display substrate 10 is more compact, and the layout space is saved. Therefore, the area occupied by the peripheral region in the display substrate 10 can be reduced, so that the size of the frame of the display device including the display substrate 10 can be reduced, thereby facilitating the implementation of a display device with a narrow frame.

For example, as shown in FIG. 12 and FIG. 13A to FIG. 13C, the plurality of shift register units include the first shift register unit 200(1), the second shift register unit 200(2), the third shift register unit 200(3), and the fourth shift register unit 200(4) that are arranged adjacently and in sequence in the first direction RE The input circuit 210 (the input signal connection line CL3) in the fourth shift register unit 200(4) is connected to the output circuit 220 (the thirteenth transfer electrode TE13) of the first shift register unit 200(1), to use the output signal of the first shift register unit 200(1) as the input signal of the fourth shift register unit 200(4). For a detailed description of the cascading of the plurality of shift register units, reference may be made to the description of FIG. 6, and similar portions will not be repeated here.

Figure 14:
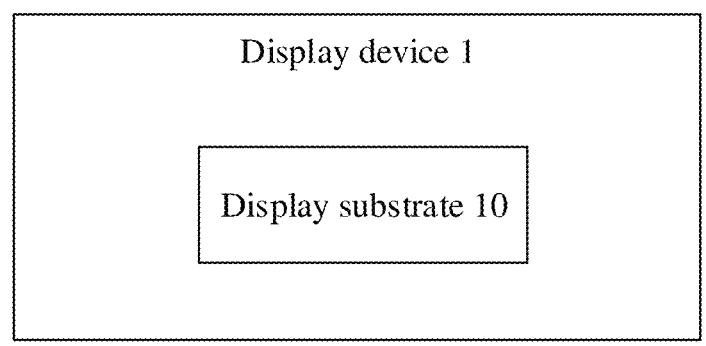
FIG. 14 is a schematic diagram of a display device according to at least one embodiment of the present disclosure.

At least one embodiment of the present disclosure further provides a display device 1, as shown in FIG. 14, the display device 1 includes any of the display substrates 10 provided by the embodiments of the present disclosure.

It should be noted that the display device 1 in the embodiment may be: a liquid crystal panel, a liquid crystal TV, a monitor, an OLED panel, an OLED TV, a QLED panel, a QLED TV, an electronic paper, a mobile phone, a tablet computer, a notebook computer, a digital photo frame, a navigator, and any product or component with a display function. The display device 1 may also include other conventional components such as a display panel, and the embodiments of the present disclosure do not limit this.

For the technical effects of the display device 1 provided by the embodiments of the present disclosure, reference may be made to the corresponding descriptions of the shift register unit 200 and the display substrate 10 in the above-mentioned embodiments, and details will not be repeated here.

The above is only the specific implementation of the present disclosure, but the scope of protection of the present disclosure is not limited to this. The scope of protection of the present disclosure should be based on the scope of protection of the claims.

What is claimed is:

1. A display substrate, comprising:
  a base substrate and a plurality of shift register units disposed on the base substrate,
  wherein the plurality of shift register units are arranged side by side along a first direction;
  each shift register unit of the plurality of shift register units comprises an input circuit, an output circuit, a first reset circuit, and a frame reset signal connection line;
  the frame reset signal connection line extends along a second direction and is configured to provide a frame reset signal to the first reset circuit, the second direction and the first direction cross each other;
  the input circuit is configured to control a level of a first node in response to an input signal;
  the output circuit is configured to receive a clock signal and output the clock signal as an output signal to an output terminal under control of the level of the first node;
  the first reset circuit is configured to reset the first node and the output terminal during a period of time between two display frames of the display substrate in response to the frame reset signal;
  the first reset circuit comprises a first transistor and a second transistor, and the frame reset signal connection line, a gate electrode of the first transistor, and a gate electrode of the second transistor are disposed in a first conductive layer; and
  the shift register unit further comprises a first transfer electrode in a second conductive layer, the gate electrode of the first transistor and the gate electrode of the second transistor are connected and both are electrically connected to the frame reset signal connection line through the first transfer electrode;
  wherein the first transistor and the second transistor are arranged adjacently along the second direction;
  the shift register unit further comprises a first voltage connection line extending along the second direction, the first voltage connection line is configured to provide a first voltage to the shift register unit, and the first voltage is used to reset the first node and the output terminal during the period of time between the two display frames of the display substrate;
  the first voltage connection line, a first electrode of the first transistor and a second electrode of the first transistor, and a first electrode of the second transistor and a second electrode of the second transistor are all disposed in the second conductive layer;
  the first electrode of the first transistor is electrically connected to the first node, the first electrode of the second transistor is electrically connected to the output terminal, and the second electrode of the first transistor and the second electrode of the second transistor are both electrically connected to the first voltage connection line;
  wherein the shift register unit further comprises an input signal connection line extending along the second direction, the input signal connection line is configured to provide the input signal to the input circuit;

the input circuit comprises a third transistor, the input signal connection line and a gate electrode of the third transistor are both disposed in the first conductive layer, and the gate electrode of the third transistor is connected to the input signal connection line;

both a first electrode and a second electrode of the third transistor are disposed in the second conductive layer, the first electrode of the third transistor is electrically connected to the gate electrode of the third transistor, the second electrode of the third transistor is connected to the first electrode of the first transistor, and the first node is a junction node of the second electrode of the third transistor and the first electrode of the first transistor;

wherein the shift register unit further comprises a second transfer electrode disposed in the first conductive layer and a third transfer electrode disposed in the second conductive layer, an orthographic projection of the second transfer electrode on the base substrate and an orthographic projection of the third transfer electrode on the base substrate at least partially overlap;

the second transfer electrode is connected to the gate electrode of the third transistor, the third transfer electrode is connected to the first electrode of the third transistor, and the second transfer electrode is electrically connected to the third transfer electrode.

2. The display substrate according to claim 1, wherein the shift register unit further comprises a branch line disposed in the second conductive layer and extending along the first direction, and the branch line is connected to the first voltage connection line;

the second electrode of the first transistor and the second electrode of the second transistor are respectively arranged on both sides of the branch line, and both are connected to the branch line.

3. The display substrate according to claim 1, wherein the plurality of shift register units comprise a first shift register unit and a second shift register unit that are adjacently arranged in the first direction, the first shift register unit and the second shift register unit share a same first voltage connection line, and are distributed axially symmetrically with respect to the same first voltage connection line.

4. The display substrate according to claim 1, wherein the first electrode of the third transistor comprises a first connection portion extending along the first direction and a plurality of first protrusion portions extending along the second direction, the first connection portion is connected to the third transfer electrode, the plurality of first protrusion portions are connected to the first connection portion, respectively, and a plurality of first concave portions are formed between the plurality of first protrusion portions;

the second electrode of the third transistor comprises a second connection portion extending along the first direction and a plurality of second protrusion portions extending along the second direction, the plurality of second protrusion portions are connected to the second connection portion, respectively, and a plurality of second concave portions are formed between the plurality of second protrusion portions;

the plurality of first protrusion portions protrude into the plurality of second concave portions, so that the plurality of second protrusion portions and the plurality of first protrusion portions are sequentially spaced along the first direction.

5. The display substrate according to claim 1, wherein the shift register unit further comprises a clock signal connection line extending along the second direction, the clock signal connection line is configured to provide a clock signal to the output circuit;

the output circuit comprises a fourth transistor and a first capacitor;

a gate electrode of the fourth transistor and a first electrode of the first capacitor are disposed in the first conductive layer, and the first electrode of the first capacitor is on a side of the gate electrode of the fourth transistor close to a display region of the display substrate;

a first electrode of the fourth transistor, a second electrode of the fourth transistor, a second electrode of the first capacitor, and the clock signal connection line are all disposed in the second conductive layer;

the gate electrode of the fourth transistor is electrically connected to the second electrode of the third transistor, the first electrode of the fourth transistor is connected to the clock signal connection line to receive the clock signal, and the second electrode of the fourth transistor is connected to the first electrode of the second transistor;

the first electrode of the first capacitor is connected to the gate electrode of the fourth transistor, and the second electrode of the first capacitor is connected to the second electrode of the fourth transistor;

the fourth transistor comprises a plurality of sub-transistors connected in parallel along the second direction, each of the plurality of sub-transistors comprises a gate electrode disposed in the first conductive layer, a first electrode and a second electrode disposed in the second conductive layer, and an active layer disposed in the semiconductor layer; and gate electrodes of the plurality of sub-transistors are connected to each other, first electrodes of the plurality of sub-transistors are connected to each other, second electrodes of the plurality of sub-transistors are connected to each other, and active layers of the plurality of sub-transistors are sequentially arranged along the second direction and are independent and unconnected with each other.

6. The display substrate according to claim 5, wherein the shift register unit further comprises a fourth transfer electrode disposed in the first conductive layer and a fifth transfer electrode disposed in the second conductive layer, an orthographic projection of the fourth transfer electrode on the base substrate and an orthographic projection of the fifth transfer electrode on the base substrate at least partially overlap, and the fourth transfer electrode is electrically connected to the fifth transfer electrode;

the fourth transfer electrode is between the gate electrode of the third transistor and the gate electrode of the first transistor, and the fifth transfer electrode is between the second electrode of the third transistor and the first electrode of the first transistor;

the fourth transfer electrode is electrically connected to the gate electrode of the fourth transistor, and the fifth transfer electrode is connected to the first electrode of the first transistor and the second electrode of the third transistor.

7. The display substrate according to claim 6, wherein the shift register unit further comprises a first connection electrode disposed in the first conductive layer, and two ends of the first connection electrode are respectively connected to the gate electrode of the fourth transistor and the fourth transfer electrode;

the first connection electrode is on a side of the input signal connection line close to the first transistor, and an orthographic projection of the first connection electrode on the base substrate and an orthographic projection of the input signal connection line on the base substrate are partially parallel.

8. The display substrate according to claim 6, wherein the shift register unit further comprises a control circuit, and the control circuit is configured to control a level of a second node according to the level of the first node;

the control circuit comprises a fifth transistor, a sixth transistor, a seventh transistor, and an eighth transistor, a gate electrode of the fifth transistor, a gate electrode of the sixth transistor, a gate electrode of the seventh transistor, and a gate electrode of the eighth transistors are all disposed in the first conductive layer, and a first electrode of the fifth transistor, a second electrode of the fifth transistor, a first electrode of the sixth transistor, a second electrode of the sixth transistor, a first electrode of the seventh transistor, a second electrode of the seventh transistor, a first electrode of the eighth transistor, and a second electrode of the eighth transistor all are disposed in the second conductive layer;

the gate electrode of the eighth transistor is electrically connected to the first electrode of the eighth transistor and is configured to receive a second voltage different from the first voltage, the second electrode of the eighth transistor is connected to the first electrode of the seventh transistor, the gate electrode of the seventh transistor is connected to the gate electrode of the sixth transistor, and the second electrode of the seventh transistor is connected to the first voltage connection line;

the gate electrode of the fifth transistor is electrically connected to the second electrode of the eighth transistor, the first electrode of the fifth transistor is electrically connected to the first electrode of the sixth transistor, the second electrode of the fifth transistor is electrically connected to the first electrode of the eighth transistor, the gate electrode of the sixth transistor is connected to the fourth transfer electrode, and the second electrode of the sixth transistor is connected to the first voltage connection line;

the second node is a junction point of the first electrode of the fifth transistor and the first electrode of the sixth transistor.

9. The display substrate according to claim 8, wherein the shift register unit further comprises a sixth transfer electrode disposed in the first conductive layer and a seventh transfer electrode disposed in the second conductive layer, an orthographic projection of the sixth transfer electrode on the base substrate and an orthographic projection of the seventh transfer electrode on the base substrate at least partially overlap, and the sixth transfer electrode is electrically connected to the seventh transfer electrode;

the sixth transfer electrode is between the gate electrode of the fifth transistor and the gate electrode of the eighth transistor, and the sixth transfer electrode is connected to the gate electrode of the eighth transistor;

the seventh transfer electrode is between the second electrode of the fifth transistor and the first electrode of the eighth transistor, and is connected to the second electrode of the fifth transistor and the first electrode of the eighth transistor.

10. The display substrate according to claim 9, wherein the shift register unit further comprises an eighth transfer electrode disposed in the first conductive layer and a ninth transfer electrode disposed in the second conductive layer, an orthographic projection of the eighth transfer electrode on the base substrate and an orthographic projection of the ninth transfer electrode on the base substrate at least partially overlap, and the eighth transfer electrode is electrically connected to the ninth transfer electrode;

the eighth transfer electrode is on a side of the sixth transfer electrode close to the display region, and the eighth transfer electrode and the sixth transfer electrode are adjacently arranged along the second direction;

the ninth transfer electrode is on a side of the seventh transfer electrode close to the display region, and the ninth transfer electrode and the seventh transfer electrode are adjacently arranged along the second direction;

the eighth transfer electrode is connected to the gate electrode of the fifth transistor, and the ninth transfer electrode is connected to the second electrode of the eighth transistor and the first electrode of the seventh transistor.

11. The display substrate according to claim 8, wherein the shift register unit further comprises a second reset circuit, and the second reset circuit is configured to control the level of the second node in response to the input signal;

the second reset circuit comprises a ninth transistor, a gate electrode of the ninth transistor is disposed in the first conductive layer, and a first electrode and a second electrode of the ninth transistor are disposed in the second conductive layer;

the gate electrode of the ninth transistor is connected to the second transfer electrode, the first electrode of the ninth transistor is connected to the first electrode of the fifth transistor, and the second electrode of the ninth transistor is connected to the second electrode of the seventh transistor.

12. The display substrate according to claim 11, wherein the shift register unit further comprises a third reset circuit, the third reset circuit is configured to reset the first node and the output terminal under control of the level of the second node;

the third reset circuit comprises a tenth transistor and an eleventh transistor;

a gate electrode of the tenth transistor and a gate electrode of the eleventh transistor are disposed in the first conductive layer, and a first electrode of the tenth transistor, a second electrode of the tenth transistor, a first electrode of the eleventh transistor, and a second electrode of the eleventh transistor are disposed in the second conductive layer;

the gate electrode of the tenth transistor is connected to the gate electrode of the eleventh transistor, the gate electrode of the tenth transistor and the gate electrode of the eleventh transistor are both electrically connected to the second node, the first electrode of the tenth transistor is connected to the first electrode of the first transistor, the first electrode of the eleventh transistor is connected to the first electrode of the second transistor, and the second electrode of the tenth transistor and the second electrode of the eleventh transistor are both electrically connected to the first voltage connection line.

13. The display substrate according to claim 12, wherein the tenth transistor and the eleventh transistor are adjacently arranged along the second direction, the tenth transistor and the first transistor are arranged adjacently along the first direction, and the eleventh transistor and the second transistor are arranged adjacently along the first direction.

14. The display substrate according to claim 13, wherein the shift register unit further comprises a tenth transfer electrode disposed in the first conductive layer and an eleventh transfer electrode disposed in the second conductive layer, an orthographic projection of the tenth transfer electrode on the base substrate and an orthographic projection of the eleventh transfer electrode on the base substrate at least partially overlap, and the tenth transfer electrode is electrically connected to the eleventh transfer electrode;
the tenth transfer electrode is between the gate electrode of the sixth transistor and the gate electrode of the tenth transistor, and the tenth transfer electrode is connected to the gate electrode of the tenth transistor;
the eleventh transfer electrode is connected to the first electrode of the sixth transistor.

15. The display substrate according to claim 12, wherein the shift register unit further comprises a fourth reset circuit, and the fourth reset circuit is configured to reset the first node in response to a scan reset signal;
the fourth reset circuit comprises a twelfth transistor, and the twelfth transistor is on a side of the first capacitor close to the display region;
a gate electrode of the twelfth transistor is disposed in the first conductive layer, and a first electrode and a second electrode of the twelfth transistor are disposed in the second conductive layer;
the gate electrode of the twelfth transistor is configured to receive the scan reset signal, the first electrode of the twelfth transistor is electrically connected to the first node, and the second electrode of the twelfth transistor is connected to the first voltage connection line;
wherein the shift register unit further comprises a twelfth transfer electrode disposed in the second conductive layer, and the twelfth transfer electrode is connected to the first electrode of the twelfth transistor, and
an orthographic projection of the twelfth transfer electrode on the base substrate and an orthographic projection of the first electrode of the first capacitor on the base substrate at least partially overlap, and the twelfth transfer electrode is electrically connected to the first electrode of the first capacitor.

16. The display substrate according to claim 15, wherein a shape of an orthographic projection of one of a first electrode and a second electrode of any transistor in the shift register unit on the base substrate comprises at least one U shape,
a shape of an orthographic projection of the other one of the first electrode and the second electrode of the any transistor on the base substrate comprises at least one I shape.

17. A display device, comprising a display substrate, wherein the display substrate comprises:
a base substrate and a plurality of shift register units disposed on the base substrate,
wherein the plurality of shift register units are arranged side by side along a first direction;
each shift register unit of the plurality of shift register units comprises an input circuit, an output circuit, a first reset circuit, and a frame reset signal connection line;
the frame reset signal connection line extends along a second direction and is configured to provide a frame reset signal to the first reset circuit, the second direction and the first direction cross each other;

the input circuit is configured to control a level of a first node in response to an input signal;
the output circuit is configured to receive a clock signal and output the clock signal as an output signal to an output terminal under control of the level of the first node;
the first reset circuit is configured to reset the first node and the output terminal during a period of time between two display frames of the display substrate in response to the frame reset signal;
the first reset circuit comprises a first transistor and a second transistor, and the frame reset signal connection line, a gate electrode of the first transistor, and a gate electrode of the second transistor are disposed in a first conductive layer; and
the shift register unit further comprises a first transfer electrode in a second conductive layer, the gate electrode of the first transistor and the gate electrode of the second transistor are connected and both are electrically connected to the frame reset signal connection line through the first transfer electrode;
wherein the first transistor and the second transistor are arranged adjacently along the second direction;
the shift register unit further comprises a first voltage connection line extending along the second direction, the first voltage connection line is configured to provide a first voltage to the shift register unit, and the first voltage is used to reset the first node and the output terminal during the period of time between the two display frames of the display substrate;
the first voltage connection line, a first electrode of the first transistor and a second electrode of the first transistor, and a first electrode of the second transistor and a second electrode of the second transistor are all disposed in the second conductive layer;
the first electrode of the first transistor is electrically connected to the first node, the first electrode of the second transistor is electrically connected to the output terminal, and the second electrode of the first transistor and the second electrode of the second transistor are both electrically connected to the first voltage connection line;
wherein the shift register unit further comprises an input signal connection line extending along the second direction, the input signal connection line is configured to provide the input signal to the input circuit;
the input circuit comprises a third transistor, the input signal connection line and a gate electrode of the third transistor are both disposed in the first conductive layer, and the gate electrode of the third transistor is connected to the input signal connection line;
both a first electrode and a second electrode of the third transistor are disposed in the second conductive layer, the first electrode of the third transistor is electrically connected to the gate electrode of the third transistor, the second electrode of the third transistor is connected to the first electrode of the first transistor, and the first node is a junction node of the second electrode of the third transistor and the first electrode of the first transistor;
wherein the shift register unit further comprises a second transfer electrode disposed in the first conductive layer and a third transfer electrode disposed in the second conductive layer, an orthographic projection of the second transfer electrode on the base substrate and an orthographic projection of the third transfer electrode on the base substrate at least partially overlap;

the second transfer electrode is connected to the gate electrode of the third transistor, the third transfer electrode is connected to the first electrode of the third transistor, and the second transfer electrode is electrically connected to the third transfer electrode.

* * * * *

UNITED STATES PATENT AND TRADEMARK OFFICE
CERTIFICATE OF CORRECTION

PATENT NO. : 11,908,430 B2
APPLICATION NO. : 17/778566
DATED : February 20, 2024
INVENTOR(S) : Ma et al.

Page 1 of 1

It is certified that error appears in the above-identified patent and that said Letters Patent is hereby corrected as shown below:

On the Title Page

In Column 1, item (73) Assignees, please change:
"Assignee: HEFEI XINSHENG OPTOELECTRONICS TECHNOLOGY CO., LTD., Hefei (CN); BOE TECHNOLOGY GROUP CO., LTD. LTD., Beijing (CN)"

To correctly read:
-- Assignee: HEFEI XINSHENG OPTOELECTRONICS TECHNOLOGY CO., LTD., Hefei (CN); BOE TECHNOLOGY GROUP CO., LTD., Beijing (CN) --

Signed and Sealed this
Ninth Day of April, 2024

Katherine Kelly Vidal
*Director of the United States Patent and Trademark Office*